US010096741B2

(12) United States Patent
Nishido

(10) Patent No.: US 10,096,741 B2
(45) Date of Patent: Oct. 9, 2018

(54) SEALED BODY, LIGHT-EMITTING MODULE, AND METHOD OF MANUFACTURING SEALED BODY

(71) Applicant: Semiconductor Energy Laboratory Co., Ltd., Kanagawa-ken (JP)

(72) Inventor: Yusuke Nishido, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/726,987

(22) Filed: Jun. 1, 2015

(65) Prior Publication Data
US 2015/0340649 A1 Nov. 26, 2015

Related U.S. Application Data

(63) Continuation of application No. 13/686,252, filed on Nov. 27, 2012, now Pat. No. 9,048,350.

(30) Foreign Application Priority Data

Nov. 28, 2011 (JP) .................................. 2011-259289

(51) Int. Cl.
*H01L 23/28* (2006.01)
*H01L 23/29* (2006.01)
(Continued)

(52) U.S. Cl.
CPC .......... *H01L 33/0095* (2013.01); *H01L 33/56* (2013.01); *H01L 51/0096* (2013.01);
(Continued)

(58) Field of Classification Search
CPC ..... H01L 21/56; H01L 21/561; H01L 21/563; H01L 21/565; H01L 21/566;
(Continued)

(56) References Cited

U.S. PATENT DOCUMENTS 5,995,189 A 11/1999 Zhang
6,113,450 A 9/2000 Narayanan et al.
(Continued)

FOREIGN PATENT DOCUMENTS

CN 102792773 A 11/2012
EP 2 549 834 A1 1/2013
(Continued)

OTHER PUBLICATIONS

Taiwanese Office Action re Application No. TW 101142608, dated Jun. 17, 2016.

*Primary Examiner* — Kimberly Rizkallah
*Assistant Examiner* — Dilinh Nguyen
(74) *Attorney, Agent, or Firm* — Husch Blackwell LLP

(57) ABSTRACT

A sealed body in which sealing is uniformly performed is provided. A light-emitting module in which sealing is uniformly performed is provided. A method of manufacturing the sealed body in which sealing is uniformly performed is provided. The sealed body comprises a first substrate alternately provided with a high-reflectivity region with respect to the energy ray and a low-reflectivity region with respect to the energy ray so as to overlap with a sealant surrounding a sealed object, and a second substrate capable of transmitting the energy ray. The sealed object is sealed between the first substrate and the second substrate by heating the sealant with irradiation with the energy ray through the second substrate.

9 Claims, 13 Drawing Sheets

(51) Int. Cl.
*H01L 33/00* (2010.01)
*H01L 33/56* (2010.01)
*H01L 51/00* (2006.01)
*H01L 51/52* (2006.01)
*H01L 51/56* (2006.01)

(52) U.S. Cl.
CPC .......... H01L 51/52 (2013.01); H01L 51/5243 (2013.01); H01L 51/5246 (2013.01); H01L 51/56 (2013.01); *H01L 2251/301* (2013.01); *H01L 2924/0002* (2013.01)

(58) Field of Classification Search
CPC ....... H01L 21/568; H01L 23/28; H01L 23/29; H01L 33/48; H01L 33/483; H01L 33/52; H01L 33/54; H01L 33/0095; H01L 51/52; H01L 51/0096; H01L 51/5243; H01L 51/5246; H01L 51/56; H01L 33/56; H01L 2251/301; H01L 2924/0002
USPC .............................. 257/680, 100, 787, 794
See application file for complete search history.

(56) References Cited

U.S. PATENT DOCUMENTS

| | | |
|---|---|---|
| 6,639,359 B1 | 10/2003 | Chae |
| 6,860,780 B2 | 3/2005 | Miyashita et al. |
| 6,984,159 B1 | 1/2006 | Kado et al. |
| 6,998,776 B2 | 2/2006 | Aitken et al. |
| 7,371,143 B2 * | 5/2008 | Becken .................. C03C 27/06 445/25 |
| 7,407,423 B2 | 8/2008 | Aitken et al. |
| 7,431,628 B2 | 10/2008 | Park et al. |
| 7,538,485 B2 | 5/2009 | Murayama |
| 7,602,121 B2 | 10/2009 | Aitken et al. |
| 7,701,136 B2 | 4/2010 | Kwak |
| 7,780,493 B2 | 8/2010 | Choi et al. |
| 7,837,530 B2 | 11/2010 | Park |
| 7,841,919 B2 | 11/2010 | Lee et al. |
| 7,863,207 B2 | 1/2011 | Son et al. |
| 7,868,540 B2 | 1/2011 | Kim |
| 7,871,949 B2 | 1/2011 | Lee et al. |
| 7,944,143 B2 | 5/2011 | Choi et al. |
| 8,063,560 B2 | 11/2011 | Aitken et al. |
| 8,125,146 B2 | 2/2012 | Park |
| 8,164,257 B2 | 4/2012 | Choi et al. |
| 8,192,188 B2 | 6/2012 | Kim |
| 8,742,526 B2 | 6/2014 | Iwabuchi et al. |
| 8,748,756 B2 | 6/2014 | Kasahara et al. |
| 8,860,305 B2 | 10/2014 | Abbott, Jr. et al. |
| 2004/0207314 A1 | 10/2004 | Aitken et al. |
| 2005/0168129 A1 | 8/2005 | Chi |
| 2006/0084348 A1 | 4/2006 | Becken et al. |
| 2007/0170455 A1 | 7/2007 | Choi et al. |
| 2007/0170854 A1 | 7/2007 | Kwak |
| 2008/0182062 A1 | 7/2008 | Becken et al. |
| 2009/0001871 A1 | 1/2009 | Song |
| 2010/0078646 A1 | 4/2010 | Sumita et al. |
| 2010/0079065 A1 | 4/2010 | Kamiura |
| 2010/0096984 A1 | 4/2010 | Kim |
| 2010/0265078 A1 * | 10/2010 | Friedman .................. G01T 1/26 340/600 |
| 2012/0264346 A1 | 10/2012 | Shimomura et al. |
| 2012/0285200 A1 | 11/2012 | Tanaka |
| 2012/0313128 A1 | 12/2012 | Yokoyama et al. |
| 2012/0318023 A1 | 12/2012 | Shimomura |
| 2012/0319092 A1 | 12/2012 | Shimomura |
| 2013/0033839 A1 | 2/2013 | Kasahara et al. |
| 2013/0048967 A1 | 2/2013 | Nishido et al. |
| 2013/0049062 A1 | 2/2013 | Hatano et al. |
| 2013/0095582 A1 | 4/2013 | Miyairi et al. |
| 2013/0101754 A1 | 4/2013 | Shimomura et al. |

FOREIGN PATENT DOCUMENTS

| | | |
|---|---|---|
| JP | 10-134959 A | 5/1998 |
| JP | 11-329717 A | 11/1999 |
| JP | 2005-215681 A | 8/2005 |
| JP | 2006-024530 A | 1/2006 |
| JP | 2007-053030 A | 3/2007 |
| JP | 2007-140061 A | 6/2007 |
| JP | 2007-200835 A | 8/2007 |
| JP | 2007-200844 A | 8/2007 |
| JP | 2007-200890 A | 8/2007 |
| JP | 2008-517446 | 5/2008 |
| JP | 2008-171811 A | 7/2008 |
| JP | 2010-080339 A | 4/2010 |
| JP | 2010-080341 A | 4/2010 |
| JP | 2010-170949 A | 8/2010 |
| JP | 2011-018479 A | 1/2011 |
| JP | 2011-054477 A | 3/2011 |
| JP | 2011-065895 A | 3/2011 |
| JP | 2011-070797 A | 4/2011 |
| JP | 2011-142080 A | 7/2011 |
| JP | 2011-187402 A | 9/2011 |
| JP | 2011-192544 A | 9/2011 |
| KR | 2013-0016245 A | 2/2013 |
| TW | 200601887 | 1/2006 |
| TW | 201138178 | 11/2011 |
| WO | WO 2006/045067 A1 | 4/2006 |
| WO | WO 2011/005952 A2 | 1/2011 |
| WO | WO 2011/111637 A1 | 9/2011 |

* cited by examiner

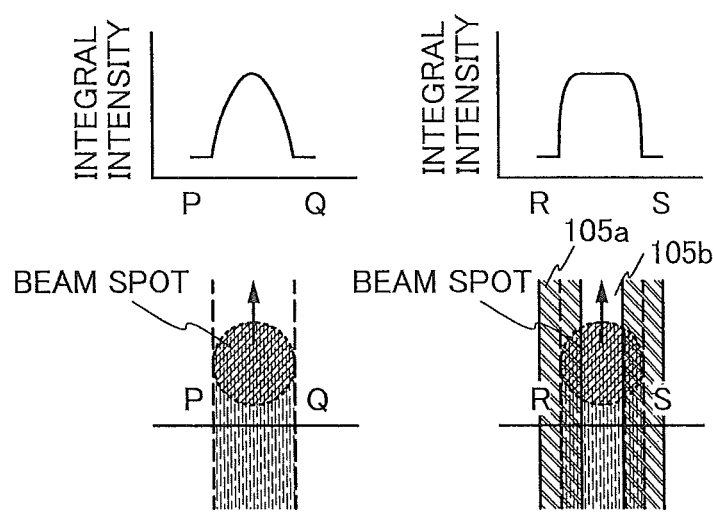

SEALED BODY, LIGHT-EMITTING MODULE, AND METHOD OF MANUFACTURING SEALED BODY

This application is a continuation of copending U.S. application Ser. No. 13/686,252, filed on Nov. 27, 2012 which is incorporated herein by reference.

BACKGROUND OF THE INVENTION

1. Field of the Invention

The present invention relates to a sealed body. Further, the present invention relates to a light-emitting module in which a light-emitting element is sealed. Furthermore, the present invention relates to a method of manufacturing the sealed body.

2. Description of the Related Art

There is a known technique in which an object is sealed in a sealed body so that characteristics of the object are prevented from being degraded due to impurities from the outside.

In the case where the heat resistance of the object sealed in the sealed body is low, the temperature in the sealing step is desirably low so that damage to the object is reduced. In general, an organic material such as a resin can be solidified or cured at lower temperature than an inorganic material such as ceramics or glass, and is more advantageous in lowering the temperature in the sealing step.

On the other hand, as for a material used for a sealant, the diffusion rate of impurities therein is preferably lower. In general, an inorganic material has lower density than an organic material and has low diffusion rate of substances; thus, an inorganic material is suitable for the sealant.

In order to achieve both reduction in temperature in the sealing step and improvement in sealing performance, a structure has been used in which a glass having a lower melting point than other inorganic materials is used for the sealant. Further, there is a known method in which a low-melting-point glass interposed between a pair of substrates (at least one of which is a light-transmitting substrate capable of transmitting a laser beam) is irradiated with the laser beam to be locally heated so that the pair of substrates is attached to each other. By such a method, a sealed body can be manufactured without damage to a low-heat-resistance object sealed in the sealed body (Patent Document 1).

REFERENCE

Patent Document

[Patent Document 1] Japanese Published Patent Application No. 2007-200835

SUMMARY OF THE INVENTION

When a pair of substrates is attached to each other with a sealant which is melted by being locally heated with an energy ray such as a laser beam, a defect is caused in some cases in a portion where the sealant is not sufficiently heated or a portion excessively irradiated with the energy ray. For example, there are the following defects: a space is generated in the sealant which is not melted because it is not sufficiently heated; the sealant is subjected to ablation or flows by being excessively heated; and a structure provided in the periphery of the sealant is damaged.

The amount of energy given to the sealant depends on not only the intensity of the emitted energy ray or the easiness of absorption of the energy ray. For example, a structure on the side opposite to the side of the sealant from which the energy ray enters also affects the amount of energy given to the sealant.

For example, in the case where a sealant between a first substrate provided with regions having different reflectivities with respect to an energy ray and a second substrate capable of transmitting the energy ray is irradiated with the energy ray from the second substrate side to attach the first substrate and the second substrate to each other, the amount of energy given to the sealant overlapping with the region having lower reflectivity with respect to the energy ray on the first substrate is insufficient when the intensity of the emitted energy ray is determined according to the sealant overlapping with the region having higher reflectivity with respect to the energy ray on the first substrate. On the other hand, when the intensity of the emitted energy ray is determined according to the sealant overlapping with the region having lower reflectivity with respect to the energy ray on the first substrate, the amount of energy given to the sealant overlapping with the region having higher reflectivity with respect to the energy ray on the first substrate is excessive.

One embodiment of the present invention is made in view of the foregoing technical background. Therefore, one object is to provide a sealed body in which sealing is uniformly performed. Another object is to provide a light-emitting module in which sealing is uniformly performed. Another object is to provide a method of manufacturing the sealed body in which sealing is uniformly performed.

In order to achieve any of the above objects, one embodiment of the present invention focuses on a structure provided on the side opposite to the side of a sealant from which an energy ray enters. The present inventor has reached an idea of a structure described in this specification so that any of the above objects is achieved.

That is, a sealed body according to one embodiment of the present invention has a structure in which a first substrate and a second substrate are attached to each other with a sealant therebetween. The first substrate is alternately provided with a region having high reflectivity with respect to an energy ray and a region having low reflectivity with respect to the energy ray which overlap with the sealant surrounding a sealed object. The second substrate transmits the energy ray.

That is, one embodiment of the present invention is a sealed body including a first substrate; a second substrate capable of transmitting an energy ray; a sealed object between the first substrate and the second substrate; and a sealant which surrounds the sealed object and with which the first substrate and the second substrate are attached to each other. The first substrate is alternately provided with a high-reflectivity region capable of reflecting part of the energy ray and a low-reflectivity region having lower reflectivity with respect to the energy ray than the high-reflectivity region which overlap with the sealant. The sealant includes a low-melting-point glass layer absorbing part of the energy ray.

With the structure of the sealed body according to one embodiment of the present invention, the energy ray emitted from the second substrate side toward the high-reflectivity region is not partly absorbed by the sealant, and such an energy ray is reflected by the high-reflectivity region to reach the sealant from the first substrate side. As a result, the energy ray can be utilized not only for efficiently heating the sealant but also for uniformly heating the sealant in the thickness direction.

On the other hand, the energy ray emitted from the second substrate side toward the low-reflectivity region is not partly absorbed by the sealant, and such an energy ray reaches the low-reflectivity region. Since the reflectivity of the low-reflectivity region is lower than that of the high-reflectivity region, the efficiency of heating the sealant overlapping with the low-reflectivity region with the energy ray is lower than that of heating the sealant overlapping with the high-reflectivity region with the energy ray. As a result, the sealant is not excessively heated.

In the sealed body according to one embodiment of the present invention, the first substrate is alternately provided with the high-reflectivity region and the low-reflectivity region which overlap with the sealant. The efficiency of heating the sealant with the energy ray can be adjusted with the ratio of the area of the low-reflectivity region to the area of the high-reflectivity region. As a result, a highly reliable sealed body in which sealing is uniformly performed can be provided.

Another embodiment of the present invention is the sealed body in which the high-reflectivity region and the low-reflectivity region extend along the sealant.

A function and an effect of the structure of the sealed body according to one embodiment of the present invention will be described with reference to a sealed body which is manufactured in such a manner that a sealant is irradiated with an energy ray from a second substrate side while scanning is performed along the sealant.

When the integral intensity of the energy ray with which the sealant is irradiated is uneven in a direction perpendicular to the scanning direction of the energy ray, the sealant cannot be uniformly heated and defective sealing occurs in some cases. However, by providing a high-reflectivity region and a low-reflectivity region in accordance with the integral intensity of the energy ray, the unevenness can be compensated for and thus the sealant can be uniformly heated. Specifically, the high-reflectivity region may be provided in a portion where the integral intensity of the laser beam becomes low, and the low-reflectivity region may be provided in a portion where the integral intensity of the laser beam becomes high. Accordingly, the unevenness of the integral intensity of the energy ray can be compensated for. As a result, a highly reliable sealed body in which sealing is uniformly performed can be provided.

Since the high-reflectivity region and the low-reflectivity region are provided along the sealant, the intensity of the energy ray reflected by the high-reflectivity region toward the sealant becomes stable; thus, a condition such as the intensity of the emitted energy ray does not need to be changed according to the structure of a scanned portion. As a result, a highly reliable sealed body in which sealing is uniformly performed can be provided. Further, an energy-ray irradiation apparatus can be simplified.

Another embodiment of the present invention is the sealed body in which the high-reflectivity region and the low-reflectivity region alternately intersect the sealant, and the high-reflectivity region and the low-reflectivity region extend outside the sealant.

A function and an effect of the structure of the sealed body according to one embodiment of the present invention will be described with reference to a sealed body which is manufactured in such a manner that a sealant is irradiated with an energy ray from a second substrate side while scanning is performed along the sealant.

When the high-reflectivity region and the low-reflectivity region alternately intersect the sealant, the sealant overlapping with the high-reflectivity region is intensively heated, and the sealant overlapping with the low-reflectivity layer is moderately heated. As a result, the sealant overlapping with the low-reflectivity region between the high-reflectivity regions suppresses conduction of heat, and a phenomenon in which the temperature of a portion that is not irradiated with the energy ray is excessively increased can be prevented.

When the high-reflectivity region and the low-reflectivity region extend outside the sealant, one of the regions which has higher thermal conductivity than the other emits unnecessary heat to the outside of the sealant; thus, a phenomenon in which the temperature of the inside of the sealed body is excessively increased can be prevented. Alternatively, a phenomenon in which the regions each having high thermal conductivity are in contact with each other outside the sealant and emitted heat is conducted can be prevented. As a result, a highly reliable sealed body in which sealing is uniformly performed can be provided.

The high-reflectivity region and the low-reflectivity region are alternately provided in a regular manner along the sealant so that the intensity of the energy ray reflected from the high-reflectivity region toward the sealant becomes stable. As a result, a condition such as the intensity of the emitted energy ray does not need to be changed according to the structure of a scanned portion. As a result, a highly reliable sealed body in which sealing is uniformly performed can be provided. Further, an energy-ray irradiation apparatus can be simplified.

Another embodiment of the present invention is the sealed body in which the ratio of the area of the low-reflectivity region to the area of the high-reflectivity region in a portion where the low-reflectivity region and the high-reflectivity region overlap with the sealant with a large radius of curvature is lower than the ratio of the area of the low-reflectivity region to the area of the high-reflectivity region in a portion where the low-reflectivity region and the high-reflectivity region overlap with the sealant with a small radius of curvature.

A function and an effect of the structure of the sealed body according to one embodiment of the present invention will be described with reference to a sealed body which is manufactured in such a manner that a sealant is irradiated with an energy ray from a second substrate side while scanning is performed along the sealant.

In order to uniformly heat the sealant, the intensity and the scanning speed of the energy ray may each be constant. However, the scanning speed in a portion where the radius of curvature of the sealant is small needs to be largely accelerated or decelerated, and it is difficult to keep the scanning speed constant. As a result, the sealant tends to be intensively heated.

The scanning speed of the energy ray is determined in consideration of the shape of the sealant, and the ratio of the area of the low-reflectivity region to the area of the high-reflectivity region is made to vary from region to region on the first substrate in advance according to the scanning speed; in such a manner, the efficiency of heating the sealant is adjusted. As a result, a highly reliable sealed body in which sealing is uniformly performed can be provided. Further, an energy-ray irradiation apparatus can be simplified.

Another embodiment of the present invention is the sealed body in which the high-reflectivity region includes a metal layer, and the low-reflectivity region includes an insulating layer.

The sealed body according to one embodiment of the present invention can be electrically connected to the outside' of the sealed body through the metal layer which overlaps with the sealant and is provided in the high-reflectivity region. As a result, a highly reliable sealed body in which sealing is uniformly performed can be provided. Further, a sealed body whose size of an outer shape is reduced can be provided. A sealed body in which various elements (e.g., an electronic element, a light-emitting element, a circuit element, a memory element, and an arithmetic element) that can be electrically connected to a circuit outside the sealed body are used as a sealed object can be provided.

Another embodiment of the present invention is a light-emitting module including the sealed body, in which, in the sealed body, a light-emitting element including a layer containing a light-emitting organic compound between a first electrode and a second electrode is sealed as the sealed object.

In the light-emitting module according to one embodiment of the present invention, even a light-emitting element whose reliability is likely to be impaired due to diffusion of impurities in the air and which does not have heat resistance high enough to withstand the sealing step performed at high temperature can be sealed without being exposed to high temperature. As a result, a highly reliable light-emitting module in which sealing is uniformly performed can be provided.

Another embodiment of the present invention is an electronic device including the light-emitting module.

The electronic device according to one embodiment of the present invention includes a highly reliable light-emitting module in which sealing is uniformly performed. As a result, a highly reliable electronic device can be provided.

Another embodiment of the present invention is a method of manufacturing a sealed body. The method includes a first step and a second step.

The first step includes the steps of preparing a first substrate provided with, on its one surface, a high-reflectivity region capable of reflecting part of an energy ray and a low-reflectivity region having lower reflectivity with respect to the energy ray than the high-reflectivity region; preparing a second substrate capable of transmitting the energy ray; preparing a sealed object; and preparing a sealant which surrounds the sealed object, includes a low-melting-point glass layer absorbing part of the energy ray at a position overlapping with the high-reflectivity region and the low-reflectivity region, and is provided on the one surface of the first substrate or one surface of the second substrate.

The second step is a step of sealing the sealed object between the first substrate and the second substrate by performing irradiation with the energy ray from the other surface side of the second substrate while scanning is performed along the sealant in a state where the sealant is interposed between the one surface of the first substrate and the one surface of the second substrate.

With the method of manufacturing the sealed body according to one embodiment of the present invention, the energy ray emitted from the second substrate side toward the high-reflectivity region is not partly absorbed by the sealant, and such an energy ray is reflected by the high-reflectivity region to reach the sealant from the first substrate side. As a result, the energy ray can be utilized not only for efficiently heating the sealant but also for uniformly heating the sealant in the thickness direction.

On the other hand, the energy ray emitted from the second substrate side toward the low-reflectivity region is not partly absorbed by the sealant, and such an energy ray reaches the low-reflectivity region. Since the reflectivity of the low-reflectivity region is lower than that of the high-reflectivity region, the efficiency of heating the sealant overlapping with the low-reflectivity region with the energy ray is lower than that of heating the sealant overlapping with the high-reflectivity region with the energy ray. As a result, the sealant is not excessively heated.

By the method of manufacturing a sealed body according to one embodiment of the present invention, the efficiency of heating the sealant with the energy ray can be adjusted with the ratio of the area of the low-reflectivity region to the area of the high-reflectivity region because the high-reflectivity region and the low-reflectivity region are alternately provided on the first substrate so as to overlap with the sealant. As a result, a method of manufacturing a highly reliable sealed body in which sealing is uniformly performed can be provided.

Another embodiment of the present invention is the method of manufacturing a sealed body, in which the scanning speed of the energy ray with which the sealant is irradiated from the second substrate side in a portion where the ratio of the area of the low-reflectivity region to the area of the high-reflectivity region is low is higher than that in a portion where the ratio of the area of the low-reflectivity region to the area of the high-reflectivity region is high.

By the method of manufacturing a sealed body according to one embodiment of the present invention, even in the case where it is difficult to perform scanning with an energy ray from an irradiation apparatus at constant speed due to the shape of a sealant (e.g., a complicatedly bent shape), a phenomenon in which irradiation with the energy ray is excessively performed so that the temperature is excessively increased can be prevented by providing the high-reflectivity region and the low-reflectivity region such that the ratio of the area of the low-reflectivity region to the area of the high-reflectivity region is high depending on the scanning speed. Further, in a portion that can be scanned at high speed, the ratio of the area of the low-reflectivity region to the area of the high-reflectivity region is made low depending on the scanning speed; thus, a phenomenon in which heating is not sufficiently performed can be prevented. As a result, a method of manufacturing a highly reliable sealed body in which sealing is uniformly performed can be provided. Further, the time needed for the sealing step can be shortened.

Note that in this specification, an "EL layer" refers to a layer provided between a pair of electrodes in a light-emitting element. Thus, a light-emitting layer containing an organic compound that is a light-emitting substance which is interposed between electrodes is an embodiment of the EL layer.

In this specification, in the case where a substance A is dispersed in a matrix formed using a substance B, the substance B forming the matrix is referred to as a host material, and the substance A dispersed in the matrix is referred to as a guest material. Note that the substance A and the substance B may each be a single substance or a mixture of two or more kinds of substances.

Note that a light-emitting device in this specification means an image display device, a light-emitting device, or a light source (including a lighting device). In addition, the light-emitting device includes any of the following modules in its category: a module in which a connector such as a flexible printed circuit (FPC) or a tape carrier package (TCP) is attached to a light-emitting device; a module having a TCP provided with a printed wiring board at the end thereof; and a module having an integrated circuit (IC) directly mounted over a substrate over which a light-emitting element is formed by a chip on glass (COG) method.

According to one embodiment of the present invention, a sealed body in which sealing is uniformly performed can be provided. Further, a light-emitting module in which sealing is uniformly performed can be provided. Furthermore, a method of manufacturing the sealed body in which sealing is uniformly performed can be provided.

BRIEF DESCRIPTION OF THE DRAWINGS

FIGS. 2A to 2C illustrate a structure of a sealed body according to an embodiment.

DETAILED DESCRIPTION OF THE INVENTION

Figure 1A:
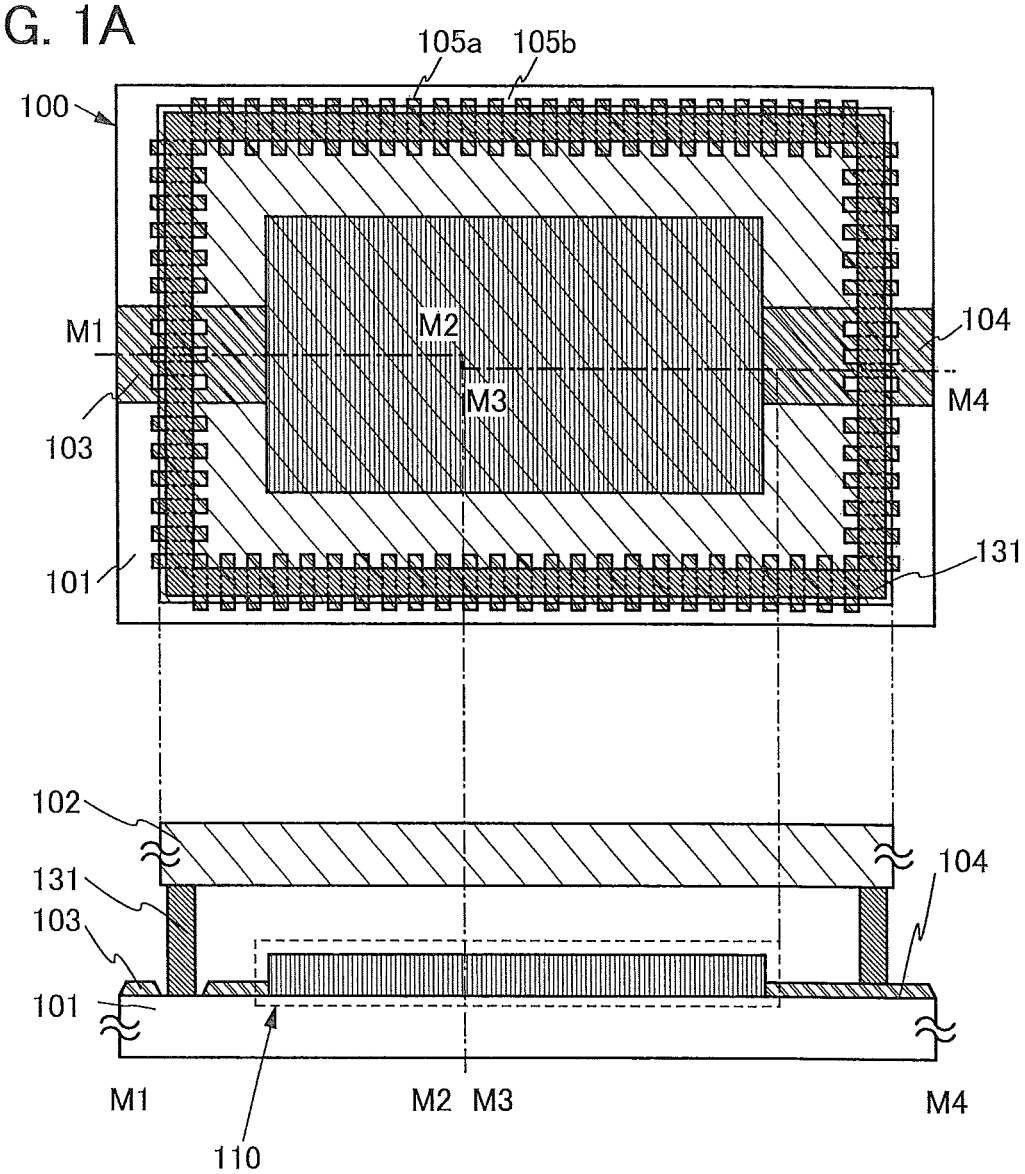
FIGS. 1A to 1C illustrate a structure of a sealed body according to an embodiment.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. In the structures described below, the same portions or portions having similar functions are denoted by the same reference numerals in different drawings, and explanation thereof will not be repeated.

Embodiment 1

In this embodiment, a structure of a sealed body according to one embodiment of the present invention will be described. Specifically, the sealed body includes a first substrate; a second substrate capable of transmitting an energy ray; a sealed object between the first substrate and the second substrate; and a sealant which surrounds the sealed object and with which the first substrate and the second substrate are attached to each other. The first substrate is alternately provided with a high-reflectivity region capable of reflecting part of the energy ray and a low-reflectivity region having lower reflectivity with respect to the energy ray than the high-reflectivity region which overlap with the sealant. The sealant includes a low-melting-point glass layer absorbing part of the energy ray.

With the structure of the sealed body described in this embodiment, the energy ray emitted from the second substrate side toward the high-reflectivity region is not partly absorbed by the sealant, and such an energy ray is reflected by the high-reflectivity region to reach the sealant from the first substrate side. As a result, the energy ray can be utilized not only for efficiently heating the sealant but also for uniformly heating the sealant in the thickness direction.

On the other hand, the energy ray emitted from the second substrate side toward the low-reflectivity region is not partly absorbed by the sealant, and such an energy ray reaches the low-reflectivity region. Since the reflectivity of the low-reflectivity region is lower than that of the high-reflectivity region, the efficiency of heating the sealant overlapping with the low-reflectivity region with the energy ray is lower than that of heating the sealant overlapping with the high-reflectivity region with the energy ray. As a result, the sealant is not excessively heated.

In the sealed body according to one embodiment of the present invention, the first substrate is alternately provided with the high-reflectivity region and the low-reflectivity region which overlap with the sealant. The efficiency of heating the sealant with the energy ray can be adjusted with the ratio of the area of the low-reflectivity region to the area of the high-reflectivity region. As a result, a highly reliable sealed body in which sealing is uniformly performed can be provided.

The structure of the sealed body in this embodiment will be described with reference to FIGS. 1A to 1C and FIGS. 2A to 2C.

Figure 1B:
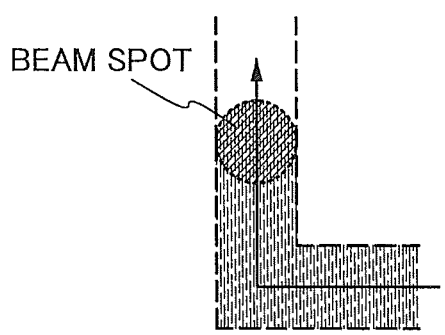

FIG. 1A is a top view of the sealed body according to one embodiment of the present invention, and FIG. 1B is a cross-sectional view taken along lines M1-M2 and M3-M4 in FIG. 1A.

Figure 1C:
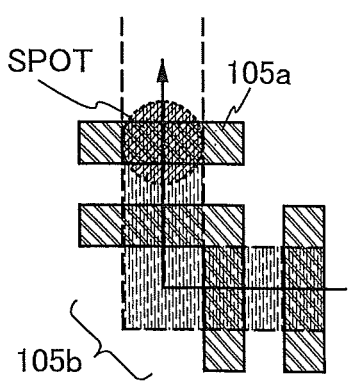

A sealed body 100 illustrated in FIGS. 1A to 1C includes a first substrate 101; a second substrate 102 capable of transmitting at least part of an energy ray; a sealed object 110; and a sealant 131 which surrounds the sealed object 110 and with which the first substrate 101 and the second substrate 102 are attached to each other.

The first substrate 101 is alternately provided with a high-reflectivity region 105a capable of reflecting part of the energy ray and a low-reflectivity region 105b having lower reflectivity with respect to the energy ray than the high-reflectivity region 105a which overlap with the sealant 131. The sealant 131 includes a low-melting-point glass layer absorbing part of the energy ray.

In the sealed body 100 illustrated in FIGS. 1A to 1C, the high-reflectivity region 105a and the low-reflectivity region 105b alternately intersect the sealant 131, and extend outside the sealant 131. A first connection terminal 103 and a second connection terminal 104 are each electrically connected to the sealed object 110.

A function and an effect of the structure of the sealed body 100 according to one embodiment of the present invention will be described with reference to a sealed body which is manufactured in such a manner that the sealant 131 is irradiated with the energy ray from the second substrate 102 side while scanning is performed along the sealant 131.

When the high-reflectivity region 105a and the low-reflectivity region 105b alternately intersect the sealant 131, the sealant 131 overlapping with the high-reflectivity region 105a is intensively heated, and the sealant 131 overlapping with the low-reflectivity region 105b is moderately heated. As a result, the sealant 131 overlapping with the low-reflectivity region 105b between the high-reflectivity regions 105a suppresses conduction of heat, and a phenomenon in which the temperature of a portion that is not irradiated with the energy ray is excessively increased can be prevented.

When the high-reflectivity region 105a and the low-reflectivity region 105b extend outside the sealant 131, one of the regions which has higher thermal conductivity than the other emits unnecessary heat to the outside of the sealant 131; thus, a phenomenon in which the temperature of the inside of the sealed body 100 is excessively increased can be prevented. Alternatively, a phenomenon in which the regions each having high thermal conductivity are in contact with each other outside the sealant 131 and emitted heat is conducted can be prevented. As a result, the highly reliable sealed body 100 in which sealing is uniformly performed can be provided.

Since the high-reflectivity region 105a and the low-reflectivity region 105b are alternately provided in a regular manner along the sealant 131, the intensity of the energy ray reflected from the high-reflectivity region 105a toward the sealant 131 becomes stable. As a result, a condition such as the intensity of the emitted energy ray does not need to be changed according to the structure of a scanned portion. As a result, the highly reliable sealed body 100 in which sealing is uniformly performed can be provided. Further, an energy-ray irradiation apparatus can be simplified.

Figure 8A:
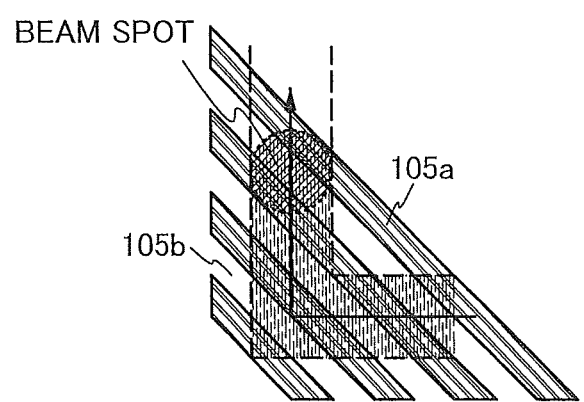
FIGS. 8A and 8B illustrate structures of a sealed body according to an embodiment.

FIG. 8A illustrates, as a modification example of this embodiment, a structure different from that in FIGS. 1A to 1C. The high-reflectivity region 105a and the low-reflectivity region 105b illustrated in FIG. 8A obliquely intersect the sealant.

In the sealed body 100 illustrated in FIGS. 1A to 1C, the ratio of the area of the low-reflectivity region 105b to the area of the high-reflectivity region 105a in a portion where the regions overlap with the sealant 131 with a large radius of curvature is lower than that in a portion where the regions overlap with the sealant 131 with a small radius of curvature.

A function and an effect of the structure of the sealed body 100 in this embodiment will be described with reference to a sealed body which is manufactured in such a manner that the sealant 131 is irradiated with the energy ray from the second substrate 102 side while scanning is performed along the sealant 131.

In order to uniformly heat the sealant 131, the intensity and scanning speed of the energy ray may each be constant regardless of the radius of curvature of the sealant 131. However, in the portion where the radius of curvature of the sealant 131 is small, the scanning speed needs to be largely accelerated or decelerated, and thus it is difficult to keep the integral intensity constant. As a result, the sealant 131 tends to be intensively heated.

The case where a laser beam is used as the energy ray will be described with reference to FIG. 1C. The diagram on the left side in FIG. 1C schematically illustrates a laser beam scanning along a curve part of the sealant 131. The laser beam traveling to the curve part from the right side of the diagram is decelerated in order to change the traveling direction at the curve part, and is accelerated in the vertical direction of the diagram. Due to such movement, the curve part is excessively irradiated with the laser beam, and thus defective sealing easily occurs.

In the sealed body according to one embodiment of the present invention, the efficiency of heating the sealant is adjusted in advance by providing the low-reflectivity region and the high-reflectivity region such that the ratio of the area of the low-reflectivity region to the area of the high-reflectivity region is changed according to the scanning speed of the energy ray. The diagram on the right side in FIG. 1C illustrates one example of the sealed body according to one embodiment of the present invention. A laser beam travels through a straight part provided with the high-reflectivity region 105a from the right side of the diagram to enter the curve part. In the curve part, the ratio of the area of the low-reflectivity region 105b to the area of the high-reflectivity region 105a is high, and thus the efficiency of heating the sealant with the laser beam is lower than that in the other regions. As a result, defective sealing is less likely to occur even in the case where the curve part is excessively irradiated with the laser beam during the period from the time when the scanning speed is decelerated in order to change the traveling direction at the curve part to the time when the scanning speed is accelerated in the vertical direction of the diagram.

That is, the scanning speed of the energy ray is determined in advance in consideration of the shape of the sealant 131, and the efficiency of heating the sealant 131 is adjusted by providing the low-reflectivity region 105b and the high-reflectivity region 105a such that the ratio of the area of the low-reflectivity region 105b to the area of the high-reflectivity region 105a is changed according to the scanning speed. As a result, a highly reliable sealed body in which sealing is uniformly performed can be provided. Further, an energy-ray irradiation apparatus can be simplified.

Figure 8B:
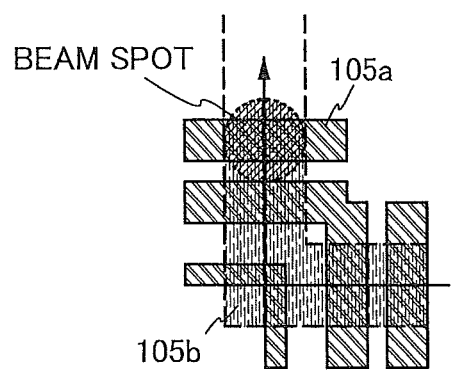

FIG. 8B illustrates, as a modification example of this embodiment, a structure different from that in FIG. 1C. In the structure illustrated in FIG. 8B, the length of the high-reflectivity region 105a in the scanning direction of the energy ray is made short in the curve part, whereby the ratio of the area of the low-reflectivity region 105b to the area of the high-reflectivity region 105a is partly made high.

Components of the sealed body in this embodiment will be described below.

<First Substrate and Second Substrate>

The first substrate 101 and the second substrate 102 each have heat resistance high enough to withstand a manufacturing process of the sealed body. The first substrate 101 and the second substrate 102 are not particularly limited in thickness and size as long as they can be used in a manufacturing apparatus. Further, the first substrate 101 and the second substrate 102 may have a single-layer structure or a layered structure of two or more layers.

The first substrate 101 and the second substrate 102 preferably have a gas barrier property. In order that the first substrate 101 and the second substrate 102 have a gas barrier property, films having a gas barrier property may be provided between the sealed object and the first substrate 101 and between the sealed object and the second substrate 102. The level of a gas barrier property may be determined according to characteristics of the sealed object.

For example, in the case where a light-emitting element including a layer containing a light-emitting organic compound between a pair of electrodes is used as the sealed object, the first substrate 101 and the second substrates 102 have such a gas barrier property that the water vapor transmittance is $10^{-5}$ g/m$^2$·day or less, preferably $10^{-6}$ g/m$^2$·day or less. By sealing the light-emitting element between the first substrate 101 and the second substrates 102 having a gas barrier property with such a level, a highly reliable light-emitting module can be provided.

The first substrate 101 and the second substrate 102 may have flexibility with which the sealant 131 is not broken. As a substrate having flexibility, for example, a glass substrate with a small thickness of 50 μm to 500 μm or a metal foil substrate can be used.

As the first substrate 101, a substrate including a composite material of an organic material and an inorganic material may be used as well as a substrate including an inorganic material. Examples of a substrate including an inorganic material include a glass substrate, a ceramic substrate, and a metal substrate. Examples of a substrate including a composite material of an organic material and an inorganic material include a lamination of a resin substrate and an inorganic material, fiberglass-reinforced plastics (FRP), and a prepreg.

As the second substrate 102, a substrate including a composite material of an organic material and an inorganic material may be used as well as a substrate including an inorganic material, as in the case of the first substrate 101. Note that the second substrate 102 is provided such that a region capable of transmitting the energy ray overlaps with the sealant 131.

Here, the energy ray that can be used in the sealing step will be described. There is no particular limitation on the energy ray as long as it can propagate energy locally to a portion irradiated with the energy ray. For example, examples of the energy ray include a particle beam (e.g., an electron beam), an electromagnetic beam (e.g., a light beam or a microwave beam), and an ultrasonic beam.

In particular, a light beam emitted from a laser (also referred to as a laser beam) is favorable. With the use of a laser beam, energy with high density can be selectively absorbed by the sealant 131 without being absorbed by the second substrate 102.

Note that the wavelength of the light beam may be selected in consideration of a combination between the second substrate 102 and the sealant 131, and any of ultraviolet light, visible light, and infrared light may be used.

As the laser, for example, a solid-state laser, a gas laser, or a semiconductor laser can be used.

Note that the second substrate 102 to which one kind of laser beam is applicable transmits that kind of laser beam. For example, in the case where a laser beam of visible light is used and an inorganic material is used for the second substrate 102, a non-alkali glass substrate, a barium borosilicate glass substrate, an aluminoborosilicate glass substrate, a quartz substrate, a sapphire substrate, or the like can be used.

<High-Reflectivity Region and Low-Reflectivity Region>

The high-reflectivity region 105a has higher reflectivity with respect to the energy ray emitted from the second substrate 102 side than the low-reflectivity region 105b. The high-reflectivity region 105a is formed of a high-reflectivity layer, and the low-reflectivity region 105b is formed of a low-reflectivity layer. Note that the low-reflectivity layer is not provided between the high-reflectivity layer of the high-reflectivity region 105a and the second substrate 102. Further, the high-reflectivity layer is not provided between the low-reflectivity layer of the low-reflectivity region 105b and the second substrate 102.

As modes of the high-reflectivity region and the low-reflectivity region, any of the following structures can be employed, for example; in the scanning direction of the energy ray, the length of the high-reflectivity region is 150 µm and the length of the low-reflectivity region is 50 µm; in the scanning direction of the energy ray, the length of the high-reflectivity region is 75 µm and the length of the low-reflectivity region is 5 µm; and in the scanning direction of the energy ray, the length of the high-reflectivity region is 50 µm and the length of the low-reflectivity region is 1 µm.

<High-Reflectivity Layer and Low-Reflectivity Layer>

The high-reflectivity layer and the low-reflectivity layer are selected such that the high-reflectivity layer of the first substrate 101 can reflect the energy ray and the reflectivity of the high-reflectivity layer is higher than that of the low-reflectivity layer.

The high-reflectivity layer or the low-reflectivity layer can be formed with a single-layer structure or a layered structure of any of a layer including a metal, a layer including an alloy, a layer including a metal nitride, a layer including a metal oxide, a layer including a semiconductor, and a layer including an insulator.

For the metal or the alloy, specifically, a metal or an alloy containing an element selected from aluminum, copper, chromium, tantalum, titanium, molybdenum, or tungsten can be used.

The alloy containing aluminum has high reflectivity in addition to high conductivity. As the alloy containing aluminum, aluminum containing nickel, aluminum containing lanthanum and nickel, aluminum containing silicon, or the like can be used.

As the metal nitride, specifically, titanium nitride, molybdenum nitride, tungsten nitride, or the like can be used.

As a stack applicable to the high-reflectivity layer or the low-reflectivity layer, a structure in which a high-melting-point metal or the metal nitride is stacked on the lower side and/or the upper side of the high-reflectivity layer or the low-reflectivity layer can be used. Note that as the high-melting-point metal, specifically, chromium, tantalum, titanium, molybdenum, tungsten, neodymium, scandium, yttrium, or the like can be used. With a structure in which the high-melting-point metal or the metal nitride is stacked on the lower side and/or the upper side of aluminum or copper, problems with heat resistance and corrosivity of aluminum or copper can be prevented from occurring.

As a structure of the high-reflectivity layer, a stack in which a tungsten layer is provided over a tantalum nitride layer, or a stack in which a 600 nm-thick aluminum layer is provided between a 100 nm-thick titanium layer and a 200 nm-thick titanium layer can be used, for example.

As the semiconductor material, for example, metal silicide or conductive metal oxide can be used. Specific examples of the conductive metal oxide include indium oxide, tin oxide, indium tin oxide (also referred to as ITO), indium zinc oxide, zinc oxide, zinc oxide to which gallium or aluminum is added, and any of the metal oxides which contain silicon oxide.

As the insulator, one insulator selected from silicon oxide, silicon oxynitride, aluminum oxide, an acrylic resin, a polyimide resin, a benzocyclobutene resin, a polyamide resin, an epoxy resin, a siloxane-based resin, an SOG, or a polysilazane-based SOG or an insulator including any one of these can be used.

<Sealed Object>

Various elements (e.g., an electronic element, a light-emitting element, a circuit element, a memory element, and an arithmetic element) can be used as the sealed object 110.

Note that part of the sealed object 110 serves as the high-reflectivity layer or the low-reflectivity layer. For example, the connection terminal of the sealed object 110 may serve as the high-reflectivity layer. Further, an antenna or a coil of the sealed object 110 may serve as the high-reflectivity layer. With such a structure, the sealed object 110 can be electrically connected to the outside of the sealed body through a metal layer overlapping with the sealant. As a result, a sealed body whose size of an outer shape is reduced can be provided. Further, a sealed body in which various elements (e.g., an electronic element, a light-emitting element, a circuit element, a memory element, and an arithmetic element) that can be electrically connected to a circuit outside the sealed body are used as a sealed object can be provided.

Note that the sealed object 110 may be provided over the first substrate 101, or part of the sealed object that is formed in advance may be connected to the other part formed over the first substrate 101 to form the sealed object 110.

<Sealant>

The sealant 131 surrounds the sealed object 110, and is positioned between and welded to the first substrate 101 and the second substrate 102. In other words, the first substrate 101 and the second substrate 102 are attached to each other with the sealant 131, and the sealed object 110 is sealed in a space surrounded by the sealant 131, the first substrate 101, and the second substrate 102.

The sealant 131 has a layer form. When the sealant 131 is irradiated with the energy ray, the sealant 131 absorbs the energy ray. The thickness of the sealant 131 is, for example, about 7 μm. The absorption of the energy ray by the sealant 131 and the thickness of the sealant 131 are preferably adjusted such that the emitted energy ray is absorbed during both a process in which it passes through the sealant 131 from the second substrate side to reach the high-reflectivity layer and a process in which the energy ray reflected by the high-reflectivity layer passes through the sealant 131 again. Accordingly, the sealant 131 can be heated uniformly in the depth direction. As a result, sealing is uniformly performed in the sealed body, and thus the sealed body can have high reliability.

The sealant 131 has a gas barrier property. For example, in the case where a light-emitting element including a layer containing a light-emitting organic compound between a pair of electrodes is used as the sealed object, the sealant preferably has such a gas barrier property that the water vapor transmittance is $10^{-5}$ g/m$^2$·day or less, preferably $10^{-6}$ g/m$^2$·day or less so that the reliability of a light-emitting module in which the light-emitting element is sealed can be improved. In particular, the sealant 131 is preferably formed using an inorganic material. An inorganic material generally has high density, a low diffusion rate of a substance, and an excellent gas barrier property compared to an organic material, and thus is suitable for the sealant.

The sealant 131 has thermal fusibility. In order to reduce damage to the sealed object 110, the first substrate 101, or the second substrate 102, a structure is selected in which the maximum temperature of the sealant 131 heated with the energy ray in the sealing step is reduced to 800° C. or lower, preferably 600° C. or lower and the sealant 131 can be welded in this range of temperature. Note that the temperature of the sealant 131 in the sealing step needs to exceed the softening point. The low-melting-point glass has a softening point of, for example, 400° C. or higher.

For example, the sealant 131 is preferably welded to the first substrate 101 or the second substrate 102 at a temperature higher than or equal to 400° C. and lower than or equal to 600° C. When the sealant 131 can be welded at 400° C. or lower, the use of the sealed body at normal temperature is adversely affected; when the sealant 131 can be welded at 600° C. or higher, the sealed object is damaged due to the heat.

The sealant 131 may include an energy ray absorber. The sealant may be selected according to the kind of emitted energy ray; for example, in the case where a semiconductor laser is used, a black pigment or the like as the absorber may be dispersed in the sealant 131.

As a material for the sealant 131, for example, low-melting-point glass, a solder, or the like can be used. Specific examples of the low-melting-point glass include a lead-based glass, a bismuth-based glass, and a vanadium-based glass. From among these materials, a low-melting-point glass that can be used for sealing at a temperature higher than or equal to 350° C. and lower than or equal to 500° C. can be selected.

Modification Example

Figure 2A:
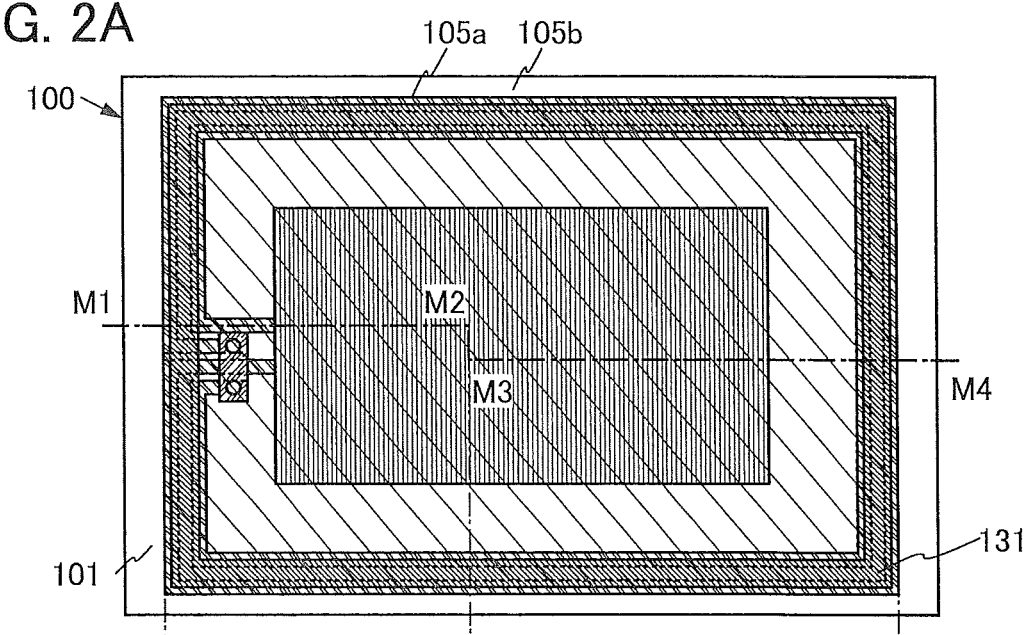
Figure 2B:
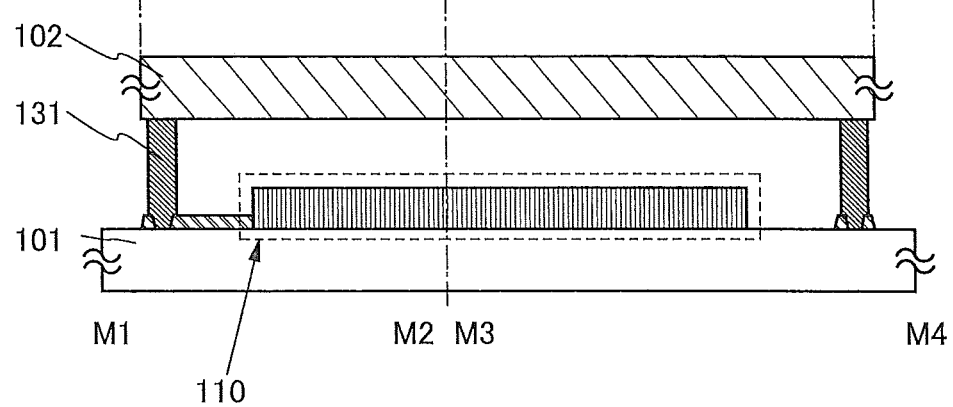

A sealed body as a modification example of this embodiment will be described with reference to FIGS. 2A to 2C. The sealed body 100 described as the modification example of this embodiment has the same structure as the sealed body 100 illustrated in FIGS. 1A to 1C except for the high-reflectivity region 105a and the low-reflectivity region 105b. Therefore, structures of the high-reflectivity region 105a and the low-reflectivity region 105b are described in detail here, and the description with reference to FIGS. 1A to 1C is referred to for the other structures.

In the sealed body 100 described in the modification example of this embodiment, the high-reflectivity region 105a and the low-reflectivity region 105b extend along the sealant 131.

For example, the high-reflectivity region 105a can be formed in such a manner that a metal layer is used as a high-reflectivity layer and is disposed in a spiral form so as to overlap with the sealant 131.

The metal layer disposed in a spiral form can serve as a coil of the sealed object 110. For example, the sealed body 100 that can be used as a radio frequency identification (RFID) tag can be formed by sealing the sealed object 110 which includes the coil overlapping with the sealant along the periphery of the sealed body and an integrated circuit connected to the coil.

A function and an effect of the structure of the sealed body in the modification example of this embodiment will be described with reference to a sealed body which is manufactured in such a manner that a sealant is irradiated with an energy ray from a second substrate side while scanning is performed along the sealant.

When the integral intensity of the energy ray is uneven in a direction perpendicular to the scanning direction of the energy ray, the sealant 131 cannot be uniformly heated and defective sealing occurs in some cases. However, by providing the high-reflectivity region 105a and the low-reflectivity region 105b in accordance with the integral intensity of the energy ray, the unevenness can be compensated for and thus the sealant 131 can be uniformly heated. Specifically, the high-reflectivity region 105a may be provided in a portion where the integral intensity of the energy ray becomes low, and the low-reflectivity region 105b may be provided in a portion where the integral intensity of the energy ray becomes high. Accordingly, the unevenness of the integral intensity of the energy ray can be compensated for. As a result, a highly reliable sealed body in which sealing is uniformly performed can be provided.

For example, in the case where irradiation with a laser beam that is used as the energy ray and projected with a circular shape on an irradiation surface is performed from the second substrate side while scanning with the laser beam is performed along the sealant 131, the integral intensity of the laser beam in a direction perpendicular to the scanning direction might be uneven (see FIG. 2C). The reason of this can be explained as follows.

When a laser beam spot having a circular shape is divided into strip shapes along the scanning direction, one of them at the center has the longest length which is substantially equal to the diameter of the laser beam spot. The strip shape nearer to the end portion of the laser beam spot has a shorter length. When scanning is performed with such a laser beam spot, a portion through which the strip shape including the center of the laser beam spot passes is irradiated with the laser beam for the longest time. In contrast, a portion through which the strip shape nearer to the end portion of the laser beam spot passes is irradiated with the laser beam for a shorter time. For such reasons, the integral intensity of the laser beam might be uneven in the direction perpendicular to the scanning direction. When such unevenness is caused, the sealant 131 cannot be uniformly heated and thus defective sealing occurs in some cases.

A phenomenon in which the integral intensity of the laser beam is uneven in the direction perpendicular to the scanning direction might be caused also when the laser beam spot has a rectangular shape or a linear shape. Specifically, such a phenomenon might be caused when the integral energy intensity of the end portion of the rectangular or linear laser beam spot is lower than that of the center thereof.

The sealed body described in the modification example of this embodiment includes the high-reflectivity region 105a and the low-reflectivity region 105b which are placed in consideration of the integral intensity of the emitted energy ray (see FIG. 2C). Specifically, the high-reflectivity region 105a is provided in the portion where the integral intensity of the emitted energy ray becomes low (for example, the portion irradiated with the end portion of the laser beam spot), and the low-reflectivity region 105b is provided in the portion where the integral intensity of the emitted energy ray becomes high (for example, the portion irradiated with the center portion of the laser beam spot). With such a structure, the sealant 131 in a portion through which the end portion of the laser beam passes (i.e., a portion irradiated with the laser beam for a short time) is irradiated with not only light entering the sealant 131 from the second substrate 102 side but also light reflected by the high-reflectivity region 105a; thus, the unevenness of the integral intensity can be compensated for. As a result, the size of the outer shape of the sealed body is reduced and sealing is uniformly performed in the sealed body; thus, the sealed body can have high reliability.

Since the high-reflectivity region 105a and the low-reflectivity region 105b are provided along the sealant 131, the intensity of the energy ray reflected by the high-reflectivity region 105a toward the sealant 131 becomes stable; thus, a condition such as the intensity of the emitted energy ray does not need to be changed according to the structure of a scanned portion. As a result, a highly reliable sealed body in which sealing is uniformly performed can be provided. Further, an energy-ray irradiation apparatus can be simplified.

Note that this embodiment can be combined with any of the other embodiments in this specification as appropriate.

Embodiment 2

In this embodiment, a structure of a light-emitting module according to one embodiment of the present invention will be described. Specifically, the light-emitting module has the following structure: a light-emitting element including a layer containing a light-emitting organic compound between a first electrode and a second electrode is sealed as a sealed object in a sealed body including a first substrate, a second substrate capable of transmitting an energy ray, the sealed object between the first substrate and the second substrate, and a sealant which surrounds the sealant and with which the first substrate and the second substrate are attached to each other. In particular, the first substrate is alternately provided with a high-reflectivity region capable of reflecting part of the energy ray and a low-reflectivity region having lower reflectivity with respect to the energy ray than the high-reflectivity region which overlap with the sealant. The sealant includes a low-melting-point glass layer absorbing part of the energy ray.

In the light-emitting module described in this embodiment, even a light-emitting element whose reliability is likely to be impaired due to diffusion of impurities in the air and which does not have heat resistance high enough to withstand the sealing step performed at high temperature can be sealed without being exposed to high temperature. As a result, a highly reliable light-emitting module in which sealing is uniformly performed can be provided. In the light-emitting module, the light-emitting element with low heat resistance can be sealed without being damaged.

A structure of the light-emitting module in this embodiment will be described with reference to FIGS. 3A to 3D.

Figure 3A:
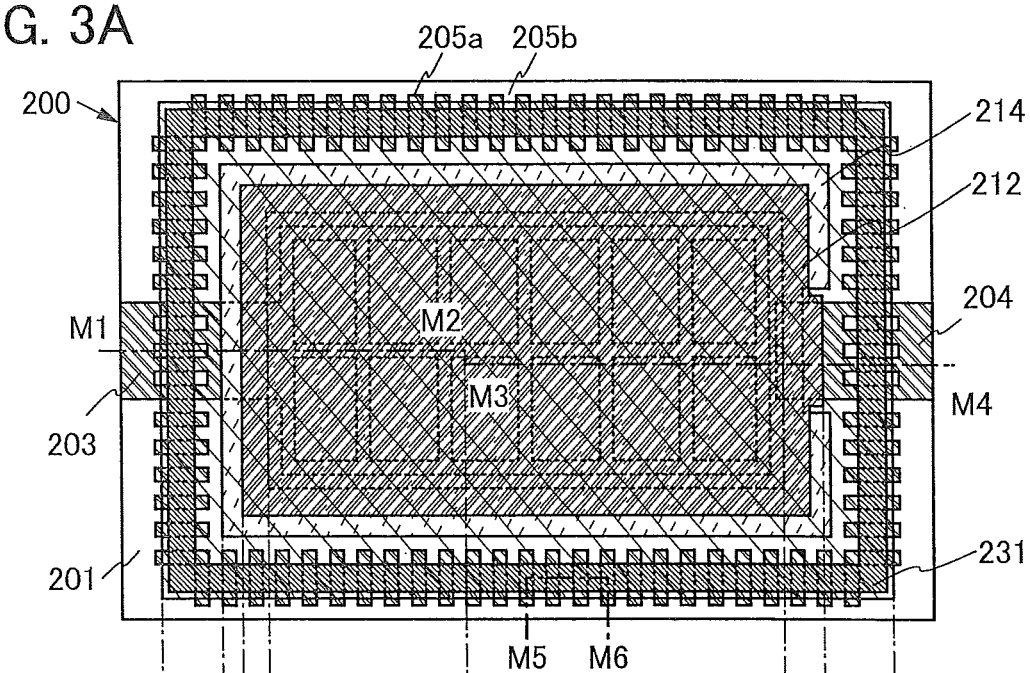
FIGS. 3A to 3D illustrate a structure of a sealed body according to an embodiment.
Figure 3B:
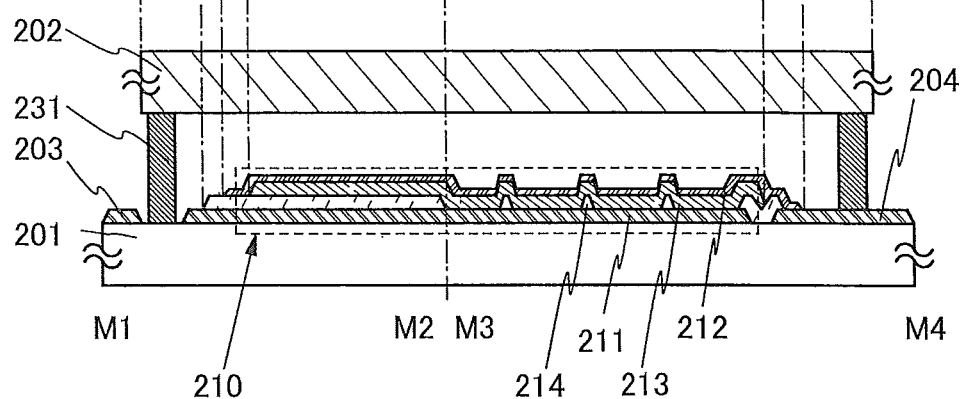
Figure 3C:
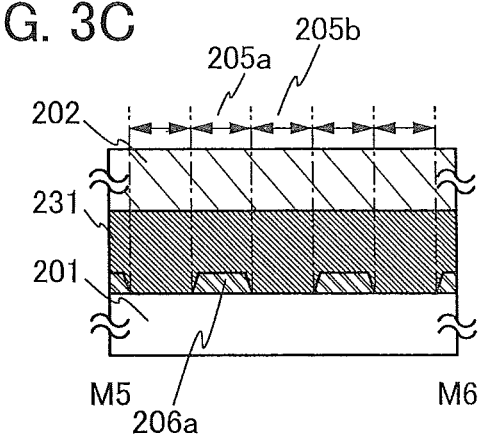
Figure 3D:
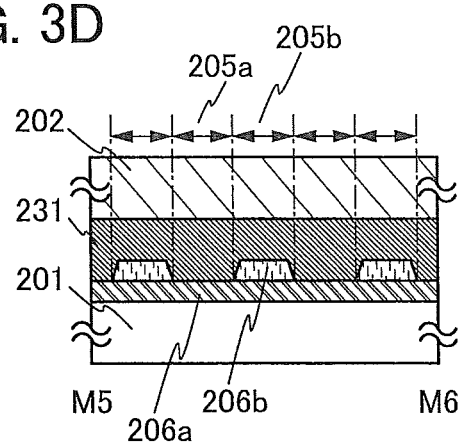

FIG. 3A is a top view of the light-emitting module according to one embodiment of the present invention, and FIG. 3B is a cross-sectional view taken along lines M1-M2 and M3-M4 in FIG. 3A. FIG. 3C is a cross-sectional view taken along line M5-M6 in FIG. 3A, and FIG. 3D is a modification example of FIG. 3C.

A light-emitting module 200 illustrated in FIGS. 3A to 3D includes a first substrate 201, a second substrate 202 capable of transmitting an energy ray, a light-emitting element 210 between the first substrate 201 and the second substrate 202, and a sealant 231 which surrounds the light-emitting element 210 and with which the first substrate 201 and the second substrate 202 are attached to each other. The light-emitting element 210 includes a first electrode 211, a second electrode 212, and a layer 213 containing a light-emitting organic compound therebetween. In particular, the first substrate 201 is alternately provided with a high-reflectivity region 205a capable of reflecting part of the energy ray and a low-reflectivity region 205b having lower reflectivity with respect to the energy ray than the high-reflectivity region 205a which overlap with the sealant 231. The sealant 231 includes a low-melting-point glass layer absorbing part of the energy ray.

Components of the light-emitting module in this embodiment will be described below.

<First Substrate and Second Substrate>

The first substrate 201 and the second substrate 202 each have heat resistance high enough to withstand a manufacturing process of the light-emitting module. The first substrate 201 and the second substrate 202 are not particularly limited in thickness and size as long as they can be used in a manufacturing apparatus. Further, the first substrate 201 and the second substrate 202 may have a single-layer structure or a layered structure of two or more layers.

The first substrate 201 and the second substrate 202 preferably have a gas barrier property. In order that the first substrate 201 and the second substrate 202 have a gas barrier property, films having a gas barrier property may be provided between the light-emitting element 210 and the first substrate 201 and between the light-emitting element 210 and the second substrate 202. The level of a gas barrier property may be determined according to characteristics of the light-emitting element 210 whose reliability is impaired by impurities diffused therein.

For example, in the case of the light-emitting element 210 including the layer 213 containing a light-emitting organic compound between a pair of electrodes, the first substrate 201 and the second substrate 202 have such a gas barrier property that the water vapor transmittance is $10^{-5}$ g/m$^2$·day or less, preferably $10^{-6}$ g/m$^2$·day or less. By sealing, between the first substrate 201 and the second substrate 202 having a gas barrier property with such a level, the light-emitting element 210 including the layer 213 containing a light-emitting organic compound between the pair of electrodes, the highly reliable light-emitting module 200 can be provided.

At least one of the pair of electrodes in the light-emitting element 210 transmits light emitted from the layer 213 containing a light-emitting organic compound. Any one of the first substrate 201 and the second substrate 202 includes a region capable of transmitting light emitted from the light-emitting element 210. Note that the region capable of transmitting the light emitted from the light-emitting element 210 preferably overlaps with the light-emitting element 210 because the light can be efficiently extracted.

The first substrate 201 and the second substrate 202 may have flexibility with which the sealant 231 is not broken. As a substrate having flexibility, for example, a glass substrate with a small thickness of 50 µm to 500 µm or a metal foil substrate can be used.

As the first substrate 201, a substrate including a composite material of an organic material and an inorganic material may be used as well as a substrate including an inorganic material. Examples of a substrate including an inorganic material include a glass substrate, a ceramic substrate, and a metal substrate. Examples of a substrate including a composite material of an organic material and an inorganic material include a lamination of a resin substrate and an inorganic material, fiberglass-reinforced plastics (FRP), and a prepreg.

As the second substrate 202, a substrate including a composite material of an organic material and an inorganic material may be used as well as a substrate including an inorganic material, as in the case of the first substrate 201. Note that the second substrate 202 is provided such that a region capable of transmitting the energy ray overlaps with the sealant 231. As for the energy ray that can be used in the sealing step, the energy ray described in Embodiment 1 can be referred to; thus, a detailed description thereof is omitted here.

The second substrate 202 to which one kind of laser beam is applicable transmits that kind of laser beam. For example, in the case where a laser beam of visible light is used and an inorganic material is used for the second substrate 202, a non-alkali glass substrate, a barium borosilicate glass substrate, an aluminoborosilicate glass substrate, a quartz substrate, a sapphire substrate, or the like can be used.

<High-Reflectivity Region and Low-Reflectivity Region>

The high-reflectivity region 205a has higher reflectivity with respect to the energy ray emitted from the second substrate 202 side than the low-reflectivity region 205b. The high-reflectivity region 205a is formed of a high-reflectivity layer 206a, and the low-reflectivity region 205b is formed of a low-reflectivity layer 206b. Note that the low-reflectivity layer 206b is not provided between the high-reflectivity layer 206a of the high-reflectivity region 205a and the second substrate 202. Further, the high-reflectivity layer 206a is not provided between the low-reflectivity layer 206b of the low-reflectivity region 205b and the second substrate 202.

A structure of the high-reflectivity region 205a and the low-reflectivity region 205b is illustrated in FIG. 3C. In the structure illustrated in FIG. 3C, the first substrate 201 also serves as a low-reflectivity layer, and the island-shaped high-reflectivity layer 206a is formed thereover. A portion where the high-reflectivity layer 206a is formed corresponds to the high-reflectivity region 205a, and a portion where the high-reflectivity layer 206a is not formed corresponds to the low-reflectivity region 205b. FIG. 3D is a modification example of FIG. 3C. In the structure illustrated in FIG. 3D, the high-reflectivity layer 206a is formed over the first substrate 201, and the island-shaped low-reflectivity layer 206b is formed thereover. A portion where the low-reflectivity layer 206b is formed corresponds to the low-reflectivity region 205b, and a portion where the low-reflectivity layer 206b is not formed corresponds to the high-reflectivity region 205a.

Alternatively, although not illustrated, the island-shaped or stripe-shaped high-reflectivity layer 206a and the island-shaped or stripe-shaped low-reflectivity layer 206b may be alternately provided over the first substrate 201. Furthermore, a layer which transmits the energy ray and to which the sealant 231 is easily welded may be provided over the island-shaped or stripe-shaped high-reflectivity layer 206a. For the layer to which the sealant 231 is easily welded, a material having high affinity with the sealant 231 is preferably used; for example, in the case where the sealant 231 is a low-melting-point glass; a layer containing silicon oxide is preferably used.

The sealant 231 provided over the high-reflectivity layer 206a or the low-reflectivity layer 206b is welded to the first substrate 201 and the second substrate 202. Note that an anchor layer may be provided to improve the welding strength between the first substrate 201 and the sealant 231. The anchor layer may be provided between the high-reflectivity layer 206a and the sealant 231 so as to be in contact with them, or may be provided between the low-reflectivity layer 206b and the sealant 231 so as to be in contact with them. Alternatively, an island-shaped or stripe-shaped anchor layer may be provided between the high-reflectivity region 205a and the low-reflectivity region 205b to improve the welding strength.

<High-Reflectivity Layer and Low-Reflectivity Layer>

For the high-reflectivity layer 206a or the low-reflectivity layer 206b in the light-emitting module 200 described in this embodiment, a material similar to that for the high-reflectivity layer or the low-reflectivity layer described in Embodiment 1 can be used.

<Sealed Object>

The light-emitting module 200 described in this embodiment includes the light-emitting element 210 as a sealed object. The sealed object includes a first connection terminal 203 electrically connected to the first electrode 211 and a second connection terminal 204 electrically connected to the second electrode 212.

The light-emitting element 210 includes the layer 213 containing a light-emitting organic compound between the first electrode 211 and the second electrode 212. When voltage is applied between the first electrode 211 and the second electrode 212 of the light-emitting element 210, the layer 213 containing a light-emitting organic compound emits light. At least one of the first electrode 211 and the second electrode 212 transmits the light emitted from the layer 213 containing a light-emitting organic compound. In the light-emitting element 210, a partition wall 214 is provided. The partition wall 214 has an insulating property, which enables light emission from the light-emitting element 210 to be divided into a plurality of parts (for example, two rows and six columns in FIGS. 3A to 3D). Note that the structure of the light-emitting element 210 will be described in detail in Embodiment 5.

The light-emitting module 200 described in this embodiment includes a layer from which the high-reflectivity layer 206a, the first electrode 211, the first connection terminal 203, and the second connection terminal 204 are formed through the same steps. In other words, the high-reflectivity layer 206a, the first electrode 211, the first connection terminal 203, and the second connection terminal 204 each reflect the energy ray and the light emitted from the layer 213 containing a light-emitting organic compound.

The first electrode 211 includes a conductive material, and may have a single-layer structure or a layered structure of two or more layers. There is no particular limitation on the thickness of the first electrode 211.

As the conductive material, any conductive material may be used as long as it has conductivity and can withstand the manufacturing process. For example, a metal selected from molybdenum, titanium, tantalum, tungsten, aluminum, silver, copper, chromium, neodymium, scandium, and the like, or an alloy containing the metal can be used.

Examples of the alloy containing aluminum include an aluminum-nickel-lanthanum alloy, an aluminum-titanium alloy, and an aluminum-neodymium alloy. Examples of the alloy containing silver include a silver-neodymium alloy and a magnesium-silver alloy. In addition, an alloy containing gold and copper can be used.

A metal nitride can be used as the conductive material. Specific examples of the metal nitride include titanium nitride, molybdenum nitride, and tungsten nitride.

Alternatively, a conductive metal oxide can be used as the conductive material. Specifically, indium oxide, tin oxide, indium tin oxide (also referred to as ITO), indium zinc oxide, zinc oxide, zinc oxide to which gallium or aluminum is added, or any of the metal oxides which contain silicon oxide can be used.

In this embodiment, a layered structure in which a layer containing titanium is stacked over a layer containing an aluminum-nickel-lanthanum alloy is used for the first electrode 211. The aluminum-nickel-lanthanum alloy has high reflectivity, and is suitable for a reflective electrode. Further, a phenomenon in which an oxide film having high resistance is formed on a surface of the first electrode 211 can be prevented owing to the layer containing titanium. As a result, loss of intensity of light emitted from the light-emitting element and loss of electric power due to electric resistance can be reduced.

The second electrode 212 in the light-emitting module 200 of this embodiment transmits light emitted from the layer 213 containing a light-emitting organic compound.

As a material for the second electrode 212, a conductive metal oxide can be used. Specific examples of the conductive metal oxide include indium oxide, tin oxide, indium tin oxide (also referred to as ITO), indium zinc oxide, zinc oxide, zinc oxide to which gallium or aluminum is added, and any of the metal oxides which contain silicon oxide.

In order that the second electrode 212 can transmit the light emitted from the layer 213 containing a light-emitting organic compound, a metal layer having a small thickness can be used; preferably, a metal layer having a thickness greater than or equal to 5 nm and less than or equal to 30 nm can be used.

Examples of a metal that can be used for the second electrode 212 include a noble metal, a rare earth metal, an alkali metal, and an alkaline earth metal. Specifically, silver, gold, ytterbium, erbium, calcium, magnesium, aluminum, or the like can be used. Alternatively, an alloy containing one of these metals may be used. Specifically, a silver-neodymium alloy, a magnesium-silver alloy, an aluminum-nickel-lanthanum alloy, an aluminum-titanium alloy, an aluminum-neodymium alloy, or the like can be used.

Modification Example

Like the light-emitting module 200, a light-emitting module in the modification example of this embodiment includes a light-emitting element including a layer containing a light-emitting organic compound between a first electrode and a second electrode. However, the light-emitting module is different from the light-emitting module 200 in that the first electrode on a first substrate side includes a conductive layer capable of transmitting light emitted from the layer containing a light-emitting organic compound.

Note that the light-emitting module in the modification example of this embodiment includes a layer from which a low-reflectivity layer and the first electrode are formed through the same steps. In other words, the low-reflectivity layer and the first electrode transmit an energy ray and the light emitted from the layer containing a light-emitting organic compound. With such a structure, the low-reflectivity layer has conductivity, and thus can be used for a wiring. As a result, the wiring having a potential different from that of a high-reflectivity layer can be provided. Alternatively, the low-reflectivity layer can be used as an auxiliary wiring for the high-reflectivity layer.

Note that this embodiment can be combined with any of the other embodiments in this specification as appropriate.

Embodiment 3

In this embodiment, a method of manufacturing the sealed body in Embodiment 1 according to one embodiment of the present invention will be described. Specifically, the method includes a first step and a second step.

The first step includes the steps of preparing a first substrate provided with, on its one surface, a high-reflectivity region capable of reflecting part of an energy ray and a low-reflectivity region having lower reflectivity with respect to the energy ray than the high-reflectivity region; preparing a second substrate capable of transmitting the energy ray; preparing a sealed object; and preparing a sealant which surrounds the sealed object, includes a low-melting-point glass layer absorbing part of the energy ray at a position overlapping with the high-reflectivity region and the low-reflectivity region, and is provided on the one surface of the first substrate or one surface of the second substrate.

The second step is a step of sealing the sealed object between the first substrate and the second substrate by performing irradiation with the energy ray from the other surface side of the second substrate while scanning is performed along the sealant in a state where the sealant is interposed between the one surface of the first substrate and the one surface of the second substrate.

With the method of manufacturing the sealed body described in this embodiment, the energy ray emitted from the second substrate side toward the high-reflectivity region is not partly absorbed by the sealant, and such an energy ray is reflected by the high-reflectivity region to reach the sealant from the first substrate side. As a result, the energy ray can be utilized not only for efficiently heating the sealant but also for uniformly heating the sealant in the thickness direction.

On the other hand, the energy ray emitted from the second substrate side toward the low-reflectivity region is not partly absorbed by the sealant, and such an energy ray reaches the low-reflectivity region. Since the reflectivity of the low-reflectivity region is lower than that of the high-reflectivity region, the efficiency of heating the sealant overlapping with the low-reflectivity region with the energy ray is lower than that of heating the sealant overlapping with the high-reflectivity region with the energy ray. As a result, the sealant is not excessively heated.

By the method of manufacturing a sealed body according to one embodiment of the present invention, the efficiency of heating the sealant with the energy ray can be adjusted with the ratio of the area of the low-reflectivity region to the area of the high-reflectivity region because the high-reflectivity region and the low-reflectivity region are alternately provided on the first substrate so as to overlap with the sealant. As a result, a method of manufacturing a highly reliable sealed body in which sealing is uniformly performed can be provided.

The method of manufacturing the sealed body in this embodiment will be described with reference to FIGS. 4A to 4D.

FIGS. 4A to 4D are cross-sectional views illustrating a method of manufacturing the sealed body according to one embodiment of the present invention.

<First Step>

Figure 4A:
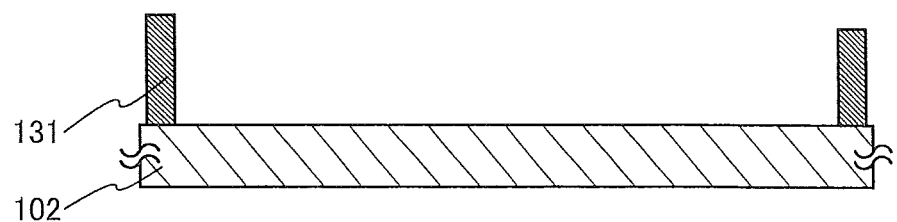
FIGS. 4A to 4D illustrate a method of manufacturing a sealed body according to an embodiment.
Figure 4B:
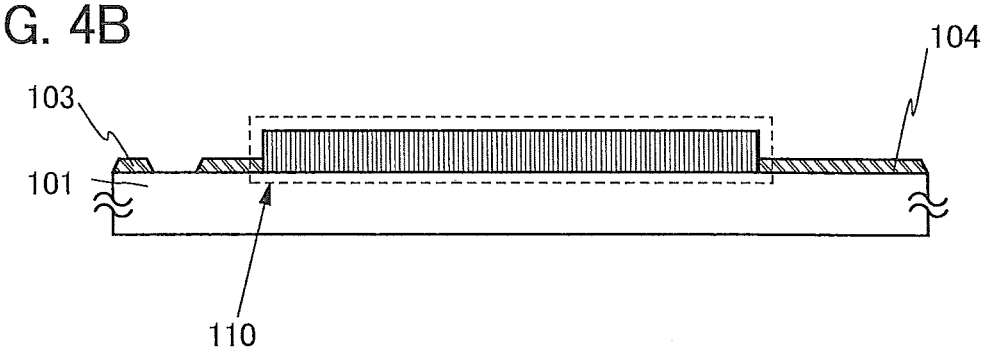

In the first step described in this embodiment, the first substrate, the second substrate, the sealed object, and the sealant are prepared (see FIGS. 4A-B).

The first substrate 101 is provided with, on its one surface, a high-reflectivity region capable of reflecting part of the energy ray and a low-reflectivity region having lower reflectivity with respect to the energy ray than the high-reflectivity region. Note that in the sealed body 100 described in this embodiment, the second connection terminal 104 of the sealed object 110 is provided in the high-reflectivity region, and serves also as part of the high-reflectivity region. The first substrate 101 serves also as part of the low-reflectivity region.

The first connection terminal 103, the second connection terminal 104, and the high-reflectivity region may be formed using a metal having higher reflectivity with respect to the energy ray than the first substrate 101. Specifically, the first connection terminal 103, the second connection terminal 104, and the high-reflectivity region can be formed by a method in which three layers of a titanium layer, an aluminum layer, and a titanium layer are stacked, and a photolithography process is performed.

In this embodiment, a substrate capable of transmitting the energy ray is prepared as the second substrate 102. In the case where a light-emitting module as the sealed body in which a light-emitting element is sealed is manufactured, a color filter or the like may be provided in advance so as not to overlap with the sealant.

The sealed object 110 is formed over the first substrate 101, and is electrically connected to the first connection terminal 103 and the second connection terminal 104. Alternatively, the sealed object 110 may be manufactured separately, and then may be electrically connected to the first connection terminal 103 and the second connection terminal 104.

The sealant 131 is formed so as to surround the sealed object 110 and overlap with the high-reflectivity region and the low-reflectivity region. In this embodiment, the case where the sealant 131 is formed on one surface of the second substrate 102 is described as an example; however, the sealant 131 may be formed on the one surface of the first substrate 101.

The sealant 131 is formed in such a manner that a dispersing element including a low-melting-point glass powder, an organic resin, and a solvent is formed so as to form a frame on the one surface of the second substrate by a screen printing method, a dispenser method, or the like. Next, heating and baking are performed so as to remove the organic resin and the solvent. In such a manner, the sealant 131 is formed.

<Second Step>

Figure 4C:
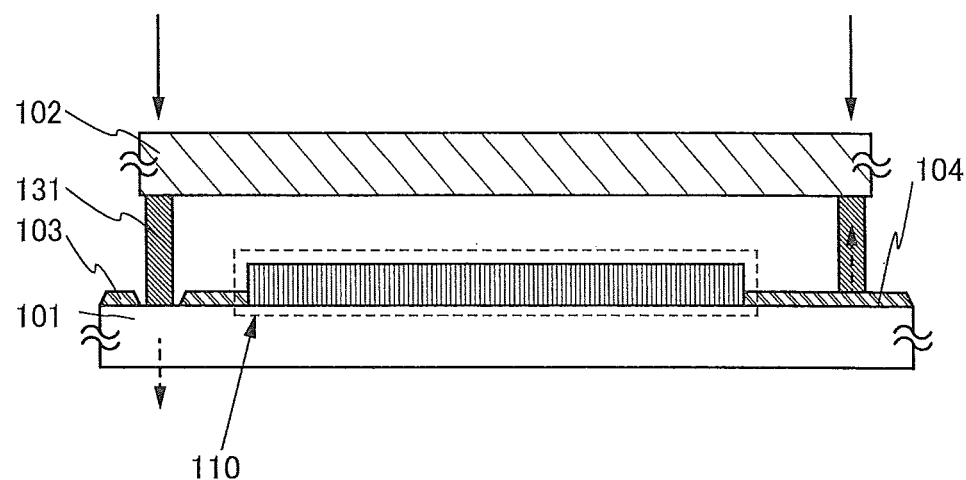
Figure 4D:
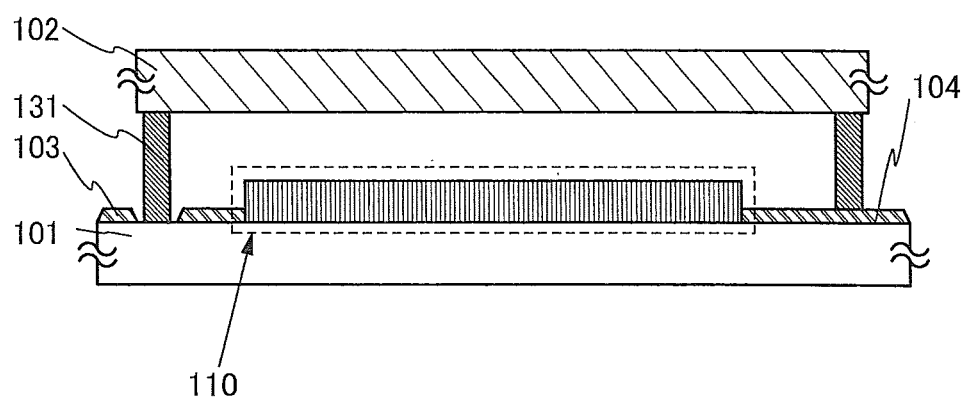

In the second step described in this embodiment, in the state where the sealant 131 is interposed between the one surface of the first substrate 101 and the one surface of the second substrate 102, irradiation with the energy ray is performed from the other surface side of the second substrate 102 while scanning with the laser beam is performed along the sealant 131 (see FIG. 4C).

In this embodiment, the case where a laser beam emitted from a semiconductor laser is used as the energy ray is described. From the side of the sealant 131 in contact with the second substrate 102, part of the laser beam entering the sealant 131 is absorbed by the sealant 131, so that the temperature of the sealant 131 is increased.

With the use of the semiconductor laser, a laser beam having a diameter of 1.6 mm and a wavelength of 940 nm can be emitted at an output of 12.5 W and a scanning speed of 10 mm/sec. Alternatively, a laser beam having a diameter of 1.6 mm and a wavelength of 940 nm can be emitted at an output of 15 W and a scanning speed of 1 mm/sec.

A laser beam which has reached the high-reflectivity region (for example, the second connection terminal 104 serving also as part of the high-reflectivity region in FIG. 4C) without being absorbed by the sealant 131 is reflected to enter the sealant 131 from the first substrate 101 side. In this manner, the sealant 131 overlapping with the high-reflectivity region is efficiently heated.

On the other hand, a laser beam which has reached the low-reflectivity region (for example, the first substrate 101 serving also as part of the low-reflectivity region in FIG. 4C) without being absorbed by the sealant 131 passes through the first substrate 101 to be lost. In this manner, the efficiency of heating the sealant 131 overlapping with the low-reflectivity region is lower than that of heating the sealant 131 overlapping with the high-reflectivity region. As a result, a method of manufacturing a highly reliable sealed body in which sealing is uniformly performed can be provided (see FIG. 4D).

Modification Example

A method of manufacturing a sealed body described in the modification example of this embodiment is the method of manufacturing a sealed body in which, in the second step, the scanning speed of the energy ray with which the sealant is irradiated from the second substrate side in a portion where the ratio of the area of the low-reflectivity region to the area of the high-reflectivity region is low is higher than that in a portion where the ratio of the area of the low-reflectivity region to the area of the high-reflectivity region is high.

By such a method, even in the case where it is difficult to perform scanning with an energy ray from an irradiation apparatus at constant speed due to the shape of a sealant (e.g., a complicatedly bent shape), a phenomenon in which irradiation with the energy ray is excessively performed so that the temperature is excessively increased can be prevented. Further, in a portion that can be scanned at high speed, the ratio of the area of the low-reflectivity region to the area of the high-reflectivity region is made low depending on with the scanning speed; thus, a phenomenon in which heating is not sufficiently performed can be prevented. As a result, a method of manufacturing a highly reliable sealed body in which sealing is uniformly performed can be provided. Further, the time needed for the sealing step can be shortened.

Note that this embodiment can be combined with any of the other embodiments in this specification as appropriate.

Embodiment 4

In this embodiment, a structure of a light-emitting panel which is one mode of a light-emitting module according to one embodiment of the present invention will be described. Specifically, the light-emitting panel in this embodiment has the following structure: a light-emitting element including a layer containing a light-emitting organic compound between a first electrode and a second electrode is sealed as a sealed object in a sealed body including a first substrate, a second substrate capable of transmitting an energy ray, the sealed object between the first substrate and the second substrate, and a sealant which surrounds the sealant and with which the first substrate and the second substrate are attached to each other. In particular, the first substrate is alternately provided with a high-reflectivity region capable of reflecting part of the energy ray and a low-reflectivity region having lower reflectivity with respect to the energy ray than the high-reflectivity region which overlap with the sealant. The sealant includes a low-melting-point glass layer absorbing part of the energy ray.

In the light-emitting panel described in this embodiment, even a light-emitting element whose reliability is likely to be impaired due to diffusion of impurities in the air and which does not have heat resistance high enough to withstand the sealing step performed at high temperature can be sealed without being exposed to high temperature. As a result, a highly reliable light-emitting panel in which sealing is uniformly performed can be provided. In the light-emitting panel, the light-emitting element with low heat resistance can be sealed without being damaged.

The structure of the light-emitting panel in this embodiment will be described with reference to FIGS. 5A and 5B. In this embodiment, an active matrix light-emitting panel in which a light-emitting element is connected to a transistor is described; however, one embodiment of the present invention is not limited to the active matrix light-emitting panel and can also be applied to a passive matrix light-emitting panel, a display device, or a lighting device.

<Active Matrix Light-Emitting Panel>

Figure 5A:
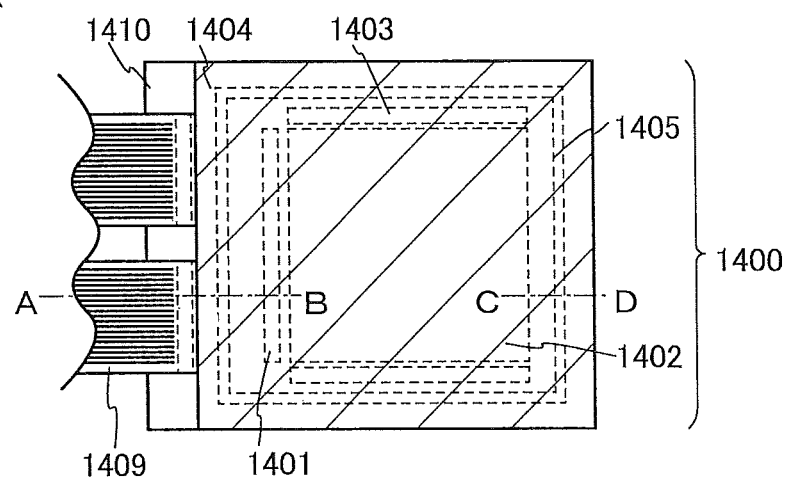
FIGS. 5A and 5B illustrate a structure of a light-emitting panel according to an embodiment.
Figure 5B:
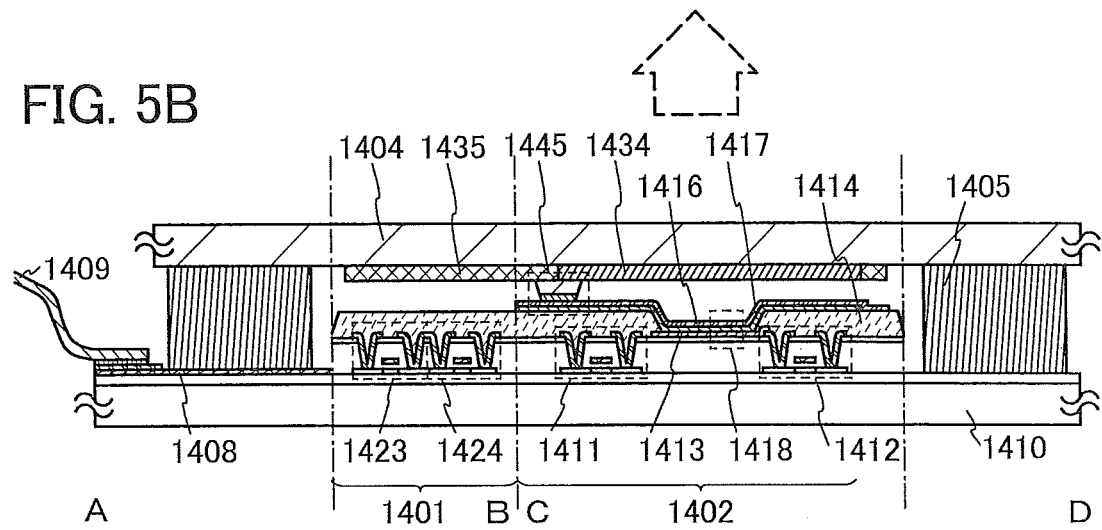

FIGS. 5A and 5B illustrate a structure of the active matrix light-emitting panel of one embodiment of the present invention. Note that FIG. 5A is a top view of the light-emitting panel, and FIG. 5B is a cross-sectional view taken along lines A-B and C-D in FIG. 5A.

An active matrix light-emitting panel 1400 includes a driver circuit portion (source side driver circuit) 1401, a pixel portion 1402, a driver circuit portion (gate side driver circuit) 1403, a second substrate 1404, and a sealant 1405 (see FIG. 5A). Note that a portion enclosed by the sealant 1405 is a space.

The light-emitting panel 1400 receives a video signal, a clock signal, a start signal, a reset signal, and the like from an FPC (flexible printed circuit) 1409 that is an external input terminal. Note that although only the FPC is illustrated here, the FPC may be provided with a printed wiring board (PWB). The light-emitting panel in this specification includes, in its category, not only a light-emitting panel itself but also a light-emitting panel provided with an FPC or a PWB.

Next, the structure of the light-emitting panel 1400 will be described with reference to the cross-sectional view of FIG. 5B. The light-emitting panel 1400 includes a driver circuit portion including the source side driver circuit 1401 illustrated over a first substrate 1410 and the pixel portion 1402 including a pixel illustrated. Further, the light-emitting panel 1400 includes a lead wiring 1408 for transmitting signals that are to be input to the source side driver circuit 1401 and the gate side driver circuit 1403.

Note that although the source side driver circuit 1401 includes a CMOS circuit in which an n-channel transistor 1423 and a p-channel transistor 1424 are combined in this embodiment, the driver circuit is not limited to this structure and may be any of a variety of circuits, such as a CMOS circuit, a PMOS circuit, or an NMOS circuit. Although a driver-integrated type in which a driver circuit is formed over the substrate is described in this embodiment, the present invention is not limited thereto, and the driver circuit can be formed not over the substrate but outside the substrate.

<Structure of Transistor>

Note that any of a variety of semiconductors can be used for a region where a channel of a transistor is formed. Specifically, an oxide semiconductor or the like can be used as well as amorphous silicon, polysilicon, or single crystal silicon.

When a single crystal semiconductor is used for a channel formation region, the size of the transistor can be reduced, which results in higher resolution pixels in a display portion.

As a single crystal semiconductor used for forming a semiconductor layer, a semiconductor substrate, typical examples of which include a single crystal semiconductor substrate formed using elements belonging to Group 14, such as a single crystal silicon substrate, a single crystal germanium substrate, or a single crystal silicon germanium substrate, and a compound semiconductor substrate (e.g., a SiC substrate, a sapphire substrate, and a GaN substrate), can be used. Preferred one is a silicon-on-insulator (SOI) substrate in which a single crystal semiconductor layer is provided on an insulating surface.

As a method of forming the SOI substrate, any of the following methods can be used: a method in which oxygen ions are implanted into a mirror-polished wafer and then heating is performed at a high temperature, whereby an oxide layer is formed at a certain depth from a surface of the wafer and a defect caused in the surface layer is eliminated; a method in which a semiconductor substrate is split by utilizing the growth of microvoids, which are formed by hydrogen ion irradiation, by heat treatment; a method in which a single crystal semiconductor layer is formed on an insulating surface by crystal growth; and the like.

In this embodiment, ions are added through one surface of a single crystal semiconductor substrate, an embrittlement layer is formed at a certain depth from the one surface of the single crystal semiconductor substrate, and an insulating layer is formed on the one surface of the single crystal semiconductor substrate or over the first substrate 1410. Heat treatment is performed in a state where the single crystal semiconductor substrate and the first substrate 1410 are bonded to each other with the insulating layer interposed therebetween, so that a crack is generated in the embrittlement layer and the single crystal semiconductor substrate is split along the embrittlement layer. Thus, a single crystal semiconductor layer, which is separated from the single crystal semiconductor substrate, is formed as a semiconductor layer over the first substrate 1410. Note that a glass substrate can be used as the first substrate 1410.

Regions electrically insulated from each other may be formed over the semiconductor substrate, and transistors 1411 and 1412 may be manufactured using the regions electrically insulated from each other.

When a channel formation region is formed using a single crystal semiconductor, variations in electrical characteristics, such as threshold voltage, between transistors due to bonding defects at grain boundaries can be reduced. Thus, in the light-emitting panel according to one embodiment of the present invention, the light-emitting elements can be operated normally without placing a circuit for compensating threshold voltage in each pixel. The number of circuit components per pixel can therefore be reduced, which results in an increase in the flexibility in layout. Thus, a high-definition light-emitting panel can be achieved. For example, a display device having a matrix of a plurality of pixels, specifically greater than or equal to 350 pixels per one inch (i.e., the horizontal resolution is greater than or equal to 350 pixels per inch (ppi)), more preferably greater than or equal to 400 pixels per one inch (i.e., the horizontal resolution is greater than or equal to 400 ppi) can be achieved.

Moreover, a transistor in which a channel formation region is formed using a single crystal semiconductor can be downsized while current drive capability is kept high. The use of the downsized transistor leads to a reduction in the area of a circuit portion that does not contribute to display, which results in an increase in the display area in the display portion and a reduction in the frame size of the light-emitting panel.

<Structure of Pixel Portion>

The pixel portion 1402 is provided with a plurality of pixels. The pixel includes a light-emitting element 1418, the current controlling transistor 1412 whose drain electrode is connected to a first electrode 1413 of the light-emitting element 1418, and the switching transistor 1411.

The light-emitting element 1418 provided in the light-emitting panel includes the first electrode 1413, a second electrode 1417, and a layer 1416 containing a light-emitting organic compound. Note that a partition wall 1414 is formed so as to cover an end portion of the first electrode 1413.

As a structure of the light-emitting element 1418, for example, the structure of the light-emitting element described as an example in Embodiment 5 can be employed.

Specifically, a structure in which white light is emitted can be employed for the layer 1416 containing a light-emitting organic compound.

With the first electrode 1413 and the second electrode 1417 of the light-emitting element 1418, a microresonator (also referred to as microcavity) can be formed. For example, the first electrode 1413 is formed using a conductive film which reflects light emitted from the layer 1416 containing a light-emitting organic compound, and the second electrode 1417 is formed using a semi-transmissive and semi-reflective conductive film which reflects part of the light and transmits part of the light.

An optical adjustment layer can be provided between the first electrode and the second electrode. The optical adjustment layer is a layer which adjusts the optical path length between the reflective first electrode 1413 and the semi-transmissive and semi-reflective second electrode 1417. By adjusting the optical adjustment layer, the wavelength of light preferentially extracted from the second electrode 1417 can be controlled.

The layer containing a light-emitting organic compound can be employed for a material that can be used for the optical adjustment layer. For example, the thickness of the optical adjustment layer may be adjusted using a charge generation region. Specifically, a region containing a substance having an excellent hole-transport property and an acceptor substance is preferably used for the optical adjustment layer because an increase in drive voltage can be suppressed even when the optical adjustment layer is thick.

A light-transmitting conductive film which transmits light emitted from the layer 1416 containing a light-emitting organic compound can also be employed for a material that can be used for the optical adjustment layer. For example, the light-transmitting conductive film is stacked over a surface of the reflective conductive film to form the first electrode 1413. This structure is preferable because the thicknesses of the optical adjustment layers over the adjacent first electrodes can be easily varied.

The partition wall 1414 is provided such that either an upper end portion or a lower end portion of the partition wall 1414 has a curved surface with a curvature. The partition wall 1414 can be formed using either a negative type photosensitive resin or a positive type photosensitive resin. For example, in the case of using positive photosensitive acrylic as a material for the partition wall 1414, the partition wall 1414 is preferably formed so as to have a curved surface with a radius of curvature (0.2 μm to 3 μm) only at the upper end portion thereof. Here, the partition wall 1414 is formed using a positive photosensitive polyimide film.

When the partition wall 1414 is made to block light, reflection of external light due to a reflective film provided in the light-emitting panel can be suppressed. When a reflective film which extends outside the light-emitting element 1418 reflects external light, the contrast of the light-emitting panel is lowered; for that reason, bright light emission cannot be obtained. When the partition wall is made to block light, it can be formed using a resin layer colored with black.

A color filter 1434 can be provided in a position overlapping with the light-emitting element 1418. In addition, a light-blocking film 1435 (also referred to as a black matrix) can be provided to overlap with the partition wall between the adjacent light-emitting elements. The color filter 1434 and the light-blocking film 1435 can be provided over the second substrate 1404.

<Sealing Structure>

The light-emitting panel 1400 described as an example in this embodiment has a structure in which the light-emitting element 1418 is sealed in a space enclosed by the first substrate 1410, the second substrate 1404, and the sealant 1405.

The sealant 1405 and the second substrate 1404 are desirably formed using a material which does not transmit impurities in the air (such as water and/or oxygen) as much as possible. The sealant 1405 includes a low-melting-point glass.

Examples of the second substrate 1404 include a glass substrate; a quartz substrate; a substrate formed of polyvinyl fluoride (PVF); a substrate formed of fiberglass-reinforced plastics (FRP); and the like.

In the light-emitting panel illustrated in FIG. 5B, the first substrate and the second substrate are attached to each other with the sealant 1405 which surrounds the light-emitting element 1418. The sealant 1405 prevents impurities which reduce the reliability of the light-emitting element 1418 from entering the light-emitting panel. As a result, a light-emitting panel with high reliability can be provided.

Note that the sealant 1405 does not include a spacer for keeping the distance between the first substrate 1410 and the second substrate 1404. With a spacer 1445, the distance between the first substrate 1410 and the second substrate 1404 is kept constant. When a filler or a spherical spacer is dispersed in the sealant 1405, stress concentrates on the filler or the spherical spacer at the time of attaching the first substrate 1410 and the second substrate 1404 to each other; thus, a transistor or a wiring formed over the first substrate below the filler or the spherical spacer might be broken. In the light-emitting panel described in this embodiment, the spacer 1445 over the partition keeps the distance between the first substrate 1410 and the second substrate 1404 constant; thus, the wiring or the transistor is less likely to be broken. In particular, the partition serves as a buffer, so that an effect of dispersing the stress can be obtained.

Note that this embodiment can be combined with any of the other embodiments in this specification as appropriate.

Embodiment 5

In this embodiment, a structure of a light-emitting element that can be used for a light-emitting module according to one embodiment of the present invention will be described. Specifically, an example of a light-emitting element in which a layer containing a light-emitting organic compound is provided between a pair of electrodes will be described with reference to FIGS. 6A to 6E.

The light-emitting element described as an example in this embodiment includes a first electrode, a second electrode, and a layer containing a light-emitting organic compound (hereinafter referred to as EL layer) provided between the first electrode and the second electrode. One of the first electrode and the second electrode serves as an anode, and the other serves as a cathode. The EL layer is provided between the first electrode and the second electrode, and a structure of the EL layer may be selected as appropriate in accordance with materials of the first electrode and the second electrode. Examples of the structure of the light-emitting element will be described below; needless to say, the structure of the light-emitting element is not limited to the examples.

Structure Example 1 of Light-Emitting Element

Figure 6A:
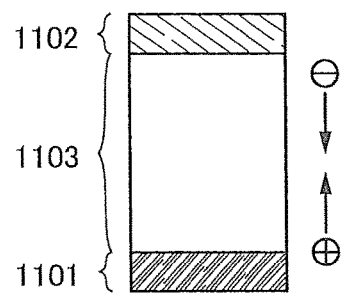
FIGS. 6A to 6E illustrate structures of a light-emitting element according to an embodiment.

An example of a structure of a light-emitting element is illustrated in FIG. 6A. In the light-emitting element illustrated in FIG. 6A, an EL layer is provided between an anode 1101 and a cathode 1102.

When voltage higher than the threshold voltage of the light-emitting element is applied between the anode 1101 and the cathode 1102, holes are injected to the EL layer from the anode 1101 side and electrons are injected to the EL layer from the cathode 1102 side. The injected electrons and holes are recombined in the EL layer, so that a light-emitting substance contained in the EL layer emits light.

In this specification, a layer or a stacked body which includes one region where electrons and holes injected from both ends are recombined is referred to as a light-emitting unit. Therefore, it can be said that Structure Example 1 of the light-emitting element includes one light-emitting unit.

A light-emitting unit 1103 may include at least one light-emitting layer containing a light-emitting substance, and may have a structure in which the light-emitting layer and a layer other than the light-emitting layer are stacked. Examples of the layer other than the light-emitting layer include a layer containing a substance having an excellent hole-injection property, a layer containing a substance having an excellent hole-transport property, a layer containing a substance having a poor hole-transport property (a substance which blocks holes), a layer containing a substance having an excellent electron-transport property, a layer containing a substance having an excellent electron-injection property, and a layer containing a substance having a bipolar property (a substance having an excellent electron-transport property and an excellent hole-transport property).

Figure 6B:
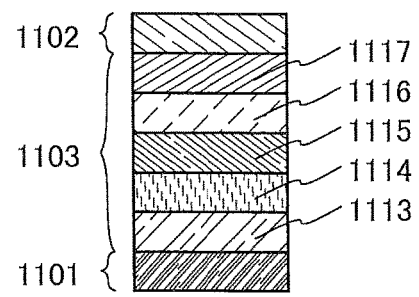

An example of a specific structure of the light-emitting unit 1103 is illustrated in FIG. 6B. In the light-emitting unit 1103 illustrated in FIG. 6B, a hole-injection layer 1113, a hole-transport layer 1114, a light-emitting layer 1115, an electron-transport layer 1116, and an electron-injection layer 1117 are stacked in this order from the anode 1101 side.

Structure Example 2 of Light-Emitting Element

Figure 6C:
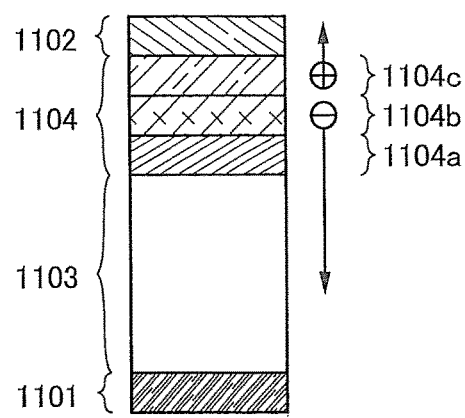

Another example of a structure of a light-emitting element is illustrated in FIG. 6C. In the light-emitting element illustrated in FIG. 6C, an EL layer including the light-emitting unit 1103 is provided between the anode 1101 and the cathode 1102. Further, an intermediate layer 1104 is provided between the cathode 1102 and the light-emitting unit 1103. Note that a structure similar to that of the light-emitting unit included in Structure Example 1 of the light-emitting element, which is described above, can be applied to the light-emitting unit 1103 in Structure Example 2 of the light-emitting element and that the description of Structure Example 1 of the light-emitting element can be referred to for the details.

The intermediate layer 1104 may be formed to include at least a charge generation region, and may have a structure in which the charge generation region and a layer other than the charge generation region are stacked. For example, a structure can be employed in which a first charge generation region 1104*c*, an electron-relay layer 1104*b*, and an electron-injection buffer 1104*a* are stacked in this order from the cathode 1102 side.

The behavior of electrons and holes in the intermediate layer 1104 will be described. When voltage higher than the threshold voltage of the light-emitting element is applied between the anode 1101 and the cathode 1102, holes and electrons are generated in the first charge generation region 1104*c*, and the holes move into the cathode 1102 and the electrons move into the electron-relay layer 1104*b*. The electron-relay layer 1104*b* has an excellent electron-transport property and immediately transfers the electrons generated in the first charge generation region 1104*c* to the electron-injection buffer 1104*a*. The electron-injection buffer 1104*a* can reduce a barrier against electron injection into the light-emitting unit 1103, so that the efficiency of the electron injection into the light-emitting unit 1103 can be improved. Thus, the electrons generated in the first charge generation region 1104*c* are injected into the LUMO level of the light-emitting unit 1103 through the electron-relay layer 1104*b* and the electron-injection buffer 1104*a*.

In addition, the electron-relay layer 1104*b* can prevent interaction in which the substance contained in the first charge generation region 1104*c* and the substance contained in the electron-injection buffer 1104*a* react with each other at the interface therebetween to impair the functions of the electron-injection buffer 1104*a* and the first charge generation region 1104*c*.

The range of choices of materials that can be used for the cathode in Structure Example 2 of the light-emitting element is wider than that of materials that can be used for the cathode in Structure Example 1 of the light-emitting element. This is because the cathode in Structure Example 2 can be formed using a material having a relatively high work function as long as the cathode receives holes generated in the intermediate layer.

Structure Example 3 of Light-Emitting Element

Figure 6D:
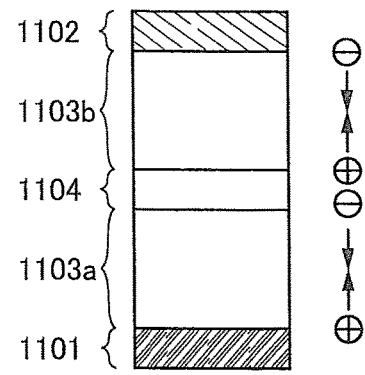
Figure 6E:
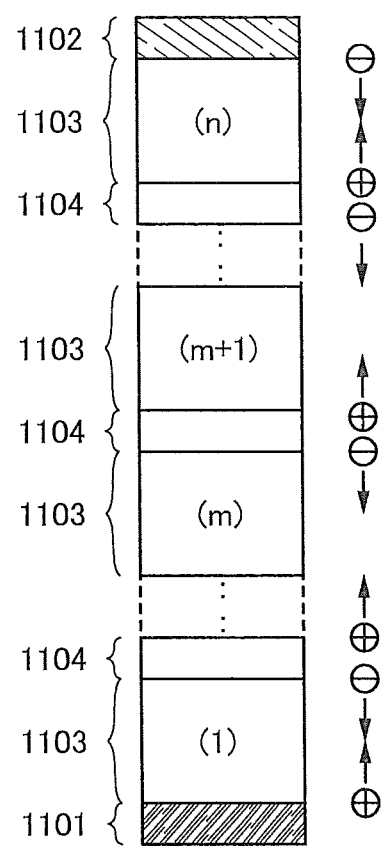

Another example of the structure of a light-emitting element is illustrated in FIG. 6D. In the light-emitting element illustrated in FIG. 6D, an EL layer including two light-emitting units is provided between the anode 1101 and the cathode 1102. Furthermore, the intermediate layer 1104 is provided between a first light-emitting unit 1103a and a second light-emitting unit 1103b.

Note that the number of the light-emitting units provided between the anode and the cathode is not limited to two. A light-emitting element illustrated in FIG. 6E has a structure in which a plurality of light-emitting units 1103 are stacked, that is, a so-called tandem structure. Note that in the case where n (n is a natural number greater than or equal to 2) light-emitting units 1103 are provided between the anode and the cathode, the intermediate layer 1104 is provided between an m-th (m is a natural number greater than or equal to 1 and less than or equal to n−1) light-emitting unit and an (m+1)-th light-emitting unit.

Note that a structure similar to that in Structure Example 1 of the light-emitting element can be applied to the light-emitting unit 1103 in Structure Example 3 of the light-emitting element; a structure similar to that in Structure Example 2 of the light-emitting element can be applied to the intermediate layer 1104 in Structure Example 3 of the light-emitting element. Therefore, the description of Structure Example 1 of the light-emitting element or the description of Structure Example 2 of the light-emitting element can be referred to for the details.

The behavior of electrons and holes in the intermediate layer 1104 provided between the light-emitting units will be described. When voltage higher than the threshold voltage of the light-emitting element is applied between the anode 1101 and the cathode 1102, holes and electrons are generated in the intermediate layer 1104, and the holes move into the light-emitting unit provided on the cathode 1102 side and the electrons move into the light-emitting unit provided on the anode side. The holes injected into the light-emitting unit provided on the cathode side are recombined with the electrons injected from the cathode side, so that a light-emitting substance contained in the light-emitting unit emits light. The electrons injected into the light-emitting unit provided on the anode side are recombined with the holes injected from the anode side, so that a light-emitting substance contained in the light-emitting unit emits light. Thus, the holes and electrons generated in the intermediate layer 1104 cause light emission in the respective light-emitting units.

Note that the light-emitting units can be provided in contact with each other when these light-emitting units allow the same structure as the intermediate layer to be formed therebetween. Specifically, when one surface of the light-emitting unit is provided with a charge generation region, the charge generation region functions as a first charge generation region of the intermediate layer; thus, the light-emitting units can be provided in contact with each other.

Structure Examples 1 to 3 of the light-emitting element can be implemented in combination. For example, an intermediate layer may be provided between the cathode and the light-emitting unit in Structure Example 3 of the light-emitting element.

<Material for Light-Emitting Element>

Next, specific materials that can be used for the light-emitting elements having the above structures will be described; materials for the anode, the cathode, and the EL layer will be described in this order.

<Material for Anode>

The anode 1101 is formed with a single-layer structure or a layered structure using any of a metal, an alloy, an electrically conductive compound, and a mixture thereof which have conductivity. In particular, a structure is preferred in which a material having a high work function (specifically, 4.0 eV or higher) is in contact with the EL layer.

As the metal or the alloy material, for example, a metal such as gold (Au), platinum (Pt), nickel (Ni), tungsten (W), chromium (Cr), molybdenum (Mo), iron (Fe), cobalt (Co), copper (Cu), palladium (Pd), or titanium (Ti), or an alloy containing any of these can be used.

As the electrically conductive compound, for example, an oxide of a metal material, a nitride of a metal material, a conductive high molecule, or the like can be used.

Specific examples of the oxide of a metal material include indium tin oxide (ITO), indium tin oxide containing silicon or silicon oxide, indium tin oxide containing titanium, indium titanium oxide, indium tungsten oxide, indium zinc oxide, and indium zinc oxide containing tungsten. Further, molybdenum oxide, vanadium oxide, ruthenium oxide, tungsten oxide, manganese oxide, titanium oxide, or the like may also be used.

A film including such an oxide of a metal material is usually formed by a sputtering method, but may be alternatively formed by application of a sol-gel method or the like. For example, an indium-zinc oxide film can be formed by a sputtering method using a target in which zinc oxide is added to indium oxide at greater than or equal to 1 wt % and less than or equal to 20 wt %. A film of indium oxide containing tungsten oxide and zinc oxide can be formed by a sputtering method using a target in which tungsten oxide and zinc oxide are added to indium oxide at greater than or equal to 0.5 wt % and less than or equal to 5 wt % and greater than or equal to 0.1 wt % and less than or equal to 1 wt %, respectively.

Specific examples of the nitride of a metal material include titanium nitride and tantalum nitride.

Specific examples of the conductive high molecule include poly(3,4-ethylenedioxythiophene)/poly(styrenesulfonic acid) (PEDOT/PSS) and polyaniline/poly(styrenesulfonic acid) (PAni/PSS).

Note that in the case where a second charge generation region is provided in contact with the anode 1101, a variety of conductive materials can be used for the anode 1101 regardless of their work functions. Specifically; besides a material which has a high work function, a material which has a low work function can also be used. Materials for forming the second charge generation region will be described later together with materials for forming the first charge generation region.

<Material for Cathode>

In the case where the first charge generation region 1104c is provided between the cathode 1102 and the light-emitting unit 1103 to be in contact with the cathode 1102, a variety of conductive materials can be used for the cathode 1102 regardless of their work functions.

Note that at least one of the cathode 1102 and the anode 1101 is formed using a conductive film which transmits visible light. For example, one of the cathode 1102 and the anode 1101 is formed using a conductive film which transmits visible light, and the other is formed using a conductive film which reflects visible light; thus, a light-emitting element emitting light in one direction can be formed. When both of the cathode 1102 and the anode 1101 are formed using a conductive film which transmits visible light, a light-emitting element emitting light in both directions can be formed.

Examples of the conductive film which transmits visible light include indium tin oxide, indium tin oxide containing silicon or silicon oxide, indium tin oxide containing titanium, indium titanium oxide, indium tungsten oxide, indium zinc oxide, and indium zinc oxide containing tungsten. Further, a metal thin film having a thickness small enough to transmit light (preferably, approximately 5 nm to 30 nm) can also be used.

For the conductive film which reflects visible light, for example, metal may be used; specifically, a metal material such as silver, aluminum, platinum, gold, or copper, or an alloy material containing any of these may be used. Examples of the alloy containing silver include a silver-neodymium alloy and a magnesium-silver alloy. Examples of the alloy containing aluminum include an aluminum-nickel-lanthanum alloy, an aluminum-titanium alloy, and an aluminum-neodymium alloy.

<Material for EL Layer>

Specific examples of materials for the layers included in the light-emitting unit 1103 will be given below.

The hole-injection layer is a layer containing a substance having an excellent hole-injection property. As the substance having an excellent hole-injection property, for example, molybdenum oxide, vanadium oxide, ruthenium oxide, tungsten oxide, manganese oxide, or the like can be used. In addition, it is possible to use a phthalocyanine-based compound such as phthalocyanine ($H_2Pc$) or copper phthalocyanine (CuPc), a high molecule such as poly(3,4-ethylenedioxythiophene)/poly(styrenesulfonate) (PEDOT/PSS), or the like to form the hole-injection layer.

Note that the hole-injection layer may be formed using the second charge generation region. When the second charge generation region is used for the hole-injection layer, a variety of conductive materials can be used for the anode 1101 regardless of their work functions as described above. Materials for forming the second charge generation region will be described later together with materials for faulting the first charge generation region.

<Hole-Transport Layer>

The hole-transport layer is a layer containing a substance having an excellent hole-transport property. The hole-transport layer may have a stacked layer of two or more layers containing a substance having an excellent hole-transport property without limitation to a single layer. A substance having a property of transporting more holes than electrons is used. In particular, a substance having a hole mobility of $10^{-6}$ cm$^2$/Vs or higher is preferably used, in which case the driving voltage of the light-emitting element can be reduced.

Examples of the substance having an excellent hole-transport property include an aromatic amine compound (e.g., 4,4'-bis[N-(1-naphthyl)-N-phenylamino]biphenyl (abbreviation: NPB or α-NPD)) and a carbazole derivative (e.g., 9-[4-(10-phenyl-9-anthracenyl)phenyl]-9H-carbazole (abbreviation: CzPA)). Further, a high molecular compound (e.g., poly(N-vinylcarbazole) (abbreviation: PVK)) or the like can also be used.

<Light-Emitting Layer>

The light-emitting layer is a layer containing a light-emitting substance. The light-emitting layer may have a stacked layer of two or more layers containing a light-emitting substance without limitation to a single layer. A fluorescent compound or a phosphorescent compound can be used as the light-emitting substance. A phosphorescent compound is preferably used as the light-emitting substance, in which case the emission efficiency of the light-emitting element can be increased.

As the light-emitting substance, a fluorescent compound (e.g., coumarin 545T), a phosphorescent compound (e.g., tris(2-phenylpyridinato)iridium(III) (abbreviation: Ir(ppy)$_3$)), or the like can be used.

The light-emitting substance is preferably dispersed in a host material. A host material preferably has higher excitation energy than the light-emitting substance.

As the host material, the above substance having an excellent hole-transport property (e.g., an aromatic amine compound, a carbazole derivative, or a high molecular compound), a substance having an excellent electron-transport property which is described later (e.g., a metal complex having a quinoline skeleton or a benzoquinoline skeleton, or a metal complex having an oxazole-based or thiazole-based ligand), or the like can be used.

<Electron-Transport Layer>

The electron-transport layer is a layer containing a substance having an excellent electron-transport property. The electron-transport layer may have a stacked layer of two or more layers containing a substance having an excellent electron-transport property without limitation to a single layer. A substance having a property of transporting more electrons than holes is used. In particular, a substance having an electron mobility of $10^{-6}$ cm$^2$/Vs or higher is preferably used, in which case the driving voltage of the light-emitting element can be reduced.

Examples of the substance having an excellent electron-transport property include a metal complex having a quinoline skeleton or a benzoquinoline skeleton (e.g., tris(8-quinolinolato)aluminum (abbreviation: Alq)), a metal complex having an oxazole-based or thiazole-based ligand (e.g., bis[2-(2-hydroxyphenyl)benzoxazolato]zinc (abbreviation: Zn(BOX)$_2$)), and other compounds (e.g., bathophenanthroline (abbreviation: BPhen)). Further, a high molecular compound (e.g., poly[(9,9-dihexylfluorene-2,7-diyl)-co-(pyridine-3,5-diyl)] (abbreviation: PF-Py)) or the like can also be used.

<Electron-Injection Layer>

The electron-injection layer is a layer containing a substance having an excellent electron-injection property. The electron-injection layer may have a stacked layer of two or more layers containing a substance having an excellent electron-injection property without limitation to a single layer. The electron-injection layer is preferably provided, in which case the efficiency of electron injection from the cathode 1102 can be increased, so that the driving voltage of the light-emitting element can be reduced.

Examples of the substance having an excellent electron-injection property include an alkali metal (e.g., lithium (Li) or cesium (Cs)), an alkaline earth metal (e.g., calcium (Ca)), and a compound thereof (e.g., an oxide (such as lithium oxide), a carbonate (such as lithium carbonate or cesium carbonate), or a halide (such as lithium fluoride (LiF), cesium fluoride (CsF), or calcium fluoride (CaF$_2$))).

Further, the layer containing a substance having an excellent electron-injection property may be formed using a layer containing the substance having an excellent electron-transport property and a donor substance (specifically, a layer of Al containing magnesium (Mg)). Note that the mass ratio of the added donor substance to the substance having an excellent electron-transport property is preferably 0.001:1 to 0.1:1.

As the donor substance, an organic compound such as tetrathianaphthacene (abbreviation: TTN), nickelocene, or decamethylnickelocene can be used as well as an alkali metal, an alkaline earth metal, a rare earth metal, and a compound thereof.

<Material for Charge Generation Region>

The first charge generation region 1104c and the second charge generation region are regions containing a substance having an excellent hole-transport property and an acceptor substance. The charge generation region may contain a substance having an excellent hole-transport property and an acceptor substance in the same film or may be a stack of a layer containing a substance having an excellent hole-transport property and a layer containing an acceptor substance. Note that in the case of a layered structure in which the first charge generation region is provided on the cathode side, the layer containing the substance having an excellent hole-transport property is in contact with the cathode 1102, and in the case of a layered structure in which the second charge generation region is provided on the anode side, the layer containing an acceptor substance is in contact with the anode 1101.

Note that the acceptor substance is preferably added to the charge generation region so that the mass ratio of the acceptor substance to the substance having an excellent hole-transport property is from 0.1:1 to 4.0:1.

As the acceptor substance that is used for the charge generation region, a transition metal oxide and an oxide of a metal belonging to any of Groups 4 to 8 of the periodic table can be given. Specifically, molybdenum oxide is particularly preferable. Note that molybdenum oxide has a poor hygroscopic property.

As the substance having an excellent hole-transport property that is used for the charge generation region, any of a variety of organic compounds such as an aromatic amine compound, a carbazole derivative, an aromatic hydrocarbon, and a high molecular compound (such as an oligomer, a dendrimer, or a polymer) can be used. Specifically, a substance having a hole mobility of $10^{-6}$ cm$^2$IVs or higher is preferably used. Any other substance that has a property of transporting more holes than electrons may be used as well.

<Material for Electron-Relay Layer>

The electron-relay layer 1104b is a layer that can immediately receive electrons extracted by the acceptor substance in the first charge generation region 1104c. Therefore, the electron-relay layer 1104b is a layer containing a substance having an excellent electron-transport property, and the LUMO level of the electron-relay layer 1104b is positioned between the acceptor level of the acceptor substance in the first charge generation region 1104c and the LUMO level of the light-emitting unit 1103 with which the electron-relay layer is in contact. Specifically, it is preferable that the LUMO level of the electron-relay layer 1104b be approximately greater than or equal to −5.0 eV and less than or equal to −3.0 eV.

Examples of the substance used for the electron-relay layer 1104b include a perylene derivative (e.g., 3,4,9,10-perylenetetracarboxylic dianhydride (abbreviation: PTCDA)) and a nitrogen-containing condensed aromatic compound (e.g., pirazino[2,3-f][1,10]phenanthroline-2,3-dicarbonitrile (abbreviation: PPDN)).

Note that a nitrogen-containing condensed aromatic compound is preferably used for the electron-relay layer 1104b because of its stability. Among nitrogen-containing condensed aromatic compounds, a compound having an electron-withdrawing group such as a cyano group or a fluoro group is preferably used, in which case electrons can be received more easily in the electron-relay layer 1104b.

<Material for Electron-Injection Buffer>

The electron-injection buffer is a layer containing a substance having an excellent electron-injection property. The electron-injection buffer 1104a is a layer which facilitates electron injection from the first charge generation region 1104c into the light-emitting unit 1103. By providing the electron-injection buffer 1104a between the first charge generation region 1104c and the light-emitting unit 1103, the injection barrier therebetween can be reduced.

Examples of a substance having an excellent electron-injection property include an alkali metal, an alkaline earth metal, a rare earth metal, and a compound thereof.

Alternatively, the layer that contains a substance having an excellent electron-injection property may be formed using a layer that contains a substance having an excellent electron-transport property and a donor substance.

<Method of Manufacturing Light-Emitting Element>

One mode of a method of manufacturing the light-emitting element will be described. Over the first electrode, the layers described above are combined as appropriate to form an EL layer. Any of a variety of methods (e.g., a dry process or a wet process) can be used for the EL layer depending on the material for the EL layer. For example, a vacuum evaporation method, a transfer method, a printing method, an inkjet method, a spin coating method, or the like may be selected. Note that a different method may be employed for each layer. A second electrode is formed over the EL layer. In the above manner, the light-emitting element is manufactured.

The light-emitting element described in this embodiment can be manufactured by combining the above materials. Light emission from the above light-emitting substance can be obtained with this light-emitting element, and the emission color can be selected by changing the type of light-emitting substance.

Further, when a plurality of light-emitting substances which emit light of different colors are used, the width of the emission spectrum can be expanded, so that, for example, white light emission can be obtained. Note that in order to obtain white light emission, for example, a structure may be employed in which at least two layers containing light-emitting substances are provided so that light of complementary colors is emitted. Specific examples of complementary colors are a combination of blue and yellow, a combination of blue-green and red, and the like.

Further, in order to obtain white light emission with an excellent color rendering property, an emission spectrum preferably spreads through the entire visible light region. For example, a light-emitting element may include layers emitting light of blue, green, and red.

Note that this embodiment can be combined with any of the other embodiments in this specification as appropriate.

Embodiment 6

In this embodiment, electronic devices according to one embodiment of the present invention will be described. Specifically, electronic devices each including a light-emitting panel according to one embodiment of the present invention will be described with reference to FIGS. 7A to 7F.

Examples of the electronic devices to which the light-emitting device is applied are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pachinko machines, and the like. Specific examples of these electronic devices are illustrated in FIGS. 7A to 7F.

Figure 7A:
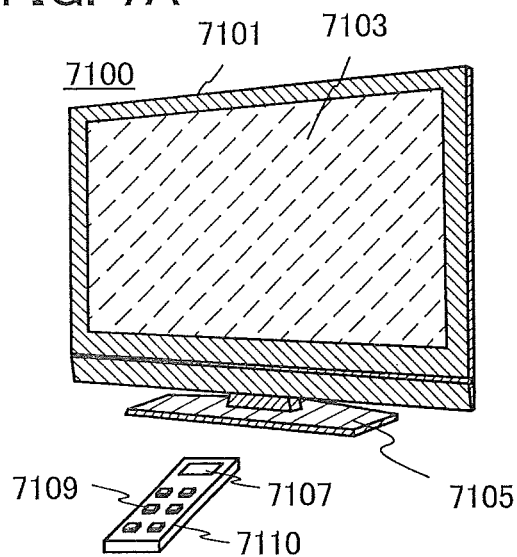
FIGS. 7A to 7F illustrate electronic devices according to an embodiment.

FIG. 7A illustrates an example of a television device. In the television device 7100, a display portion 7103 is incorporated in a housing 7101. The display portion 7103 is capable of displaying images, and the light-emitting device can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the receiver, a general television broadcast can be received. Furthermore, when the television device 7100 is connected to a communication network by wired or wireless connection via the modem, one-way (from a transmitter to a receiver) or two-way (between a transmitter and a receiver, between receivers, or the like) data communication can be performed.

Figure 7B:
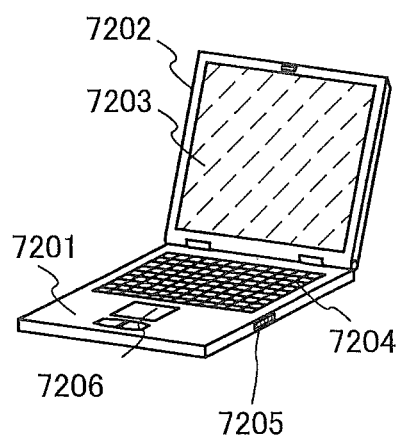

FIG. 7B illustrates a computer, which includes a main body 7201, a housing 7202, a display portion 7203, a keyboard 7204, an external connecting port 7205, a pointing device 7206, and the like. Note that this computer is manufactured using the light-emitting device for the display portion 7203.

Figure 7C:
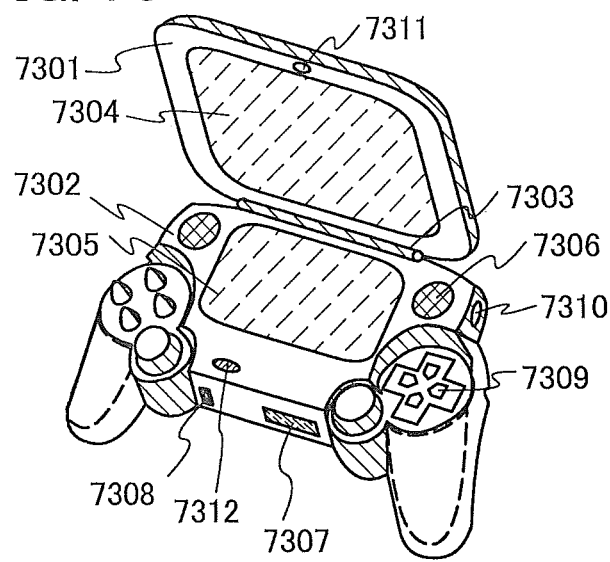

FIG. 7C illustrates a portable game machine, which includes two housings, a housing 7301 and a housing 7302, which are connected with a joint portion 7303 so that the portable game machine can be opened or folded. A display portion 7304 is incorporated in the housing 7301 and a display portion 7305 is incorporated in the housing 7302. In addition, the portable game machine illustrated in FIG. 7C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 7312), and the like. Needless to say, the structure of the portable game machine is not limited to the above as long as a light-emitting device is used for at least either the display portion 7304 or the display portion 7305, or both, and may include other accessories as appropriate. The portable game machine illustrated in FIG. 7C has a function of reading out a program or data stored in a storage medium to display it on the display portion, and a function of sharing information with another portable game machine by wireless communication. The portable game machine in FIG. 7C can have a variety of functions without limitation to the above functions.

Figure 7D:
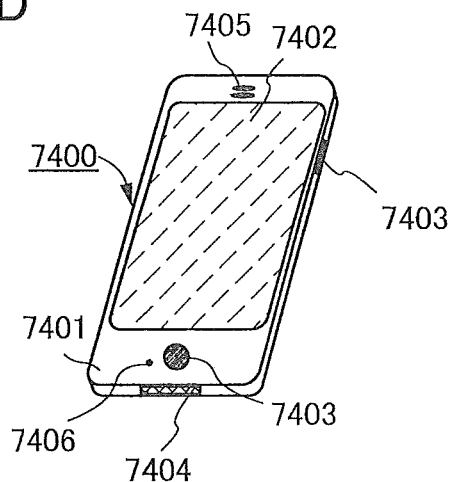

FIG. 7D illustrates an example of a cellular phone. The cellular phone 7400 is provided with a display portion 7402 incorporated in a housing 7401, operation buttons 7403, an external connection port 7404, a speaker 7405, a microphone 7406, and the like. Note that the cellular phone 7400 is manufactured using the light-emitting device for the display portion 7402.

When the display portion 7402 of the cellular phone 7400 illustrated in FIG. 7D is touched with a finger or the like, data can be input into the cellular phone 7400. Further, operations such as making a call and creating e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on a screen can be input. In this case, it is preferable to display a keyboard or number buttons on almost the entire screen of the display portion 7402.

When a detection device including a sensor for detecting inclination, such as a gyroscope or an acceleration sensor, is provided inside the cellular phone 7400, display on the screen of the display portion 7402 can be automatically changed by determining the orientation of the cellular phone 7400 (whether the cellular phone is placed horizontally or vertically for a landscape mode or a portrait mode).

The screen modes are switched by touching the display portion 7402 or operating the operation buttons 7403 of the housing 7401. The screen modes can also be switched depending on the kind of image displayed on the display portion 7402. For example, when a signal of an image displayed on the display portion is a signal of moving image data, the screen mode is changed to the display mode. When the signal is a signal of text data, the screen mode is changed to the input mode.

Moreover, in the input mode, when input by touching the display portion 7402 is not performed within a specified period while a signal detected by an optical sensor in the display portion 7402 is detected, the screen mode may be controlled so as to be changed from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Figure 7E:
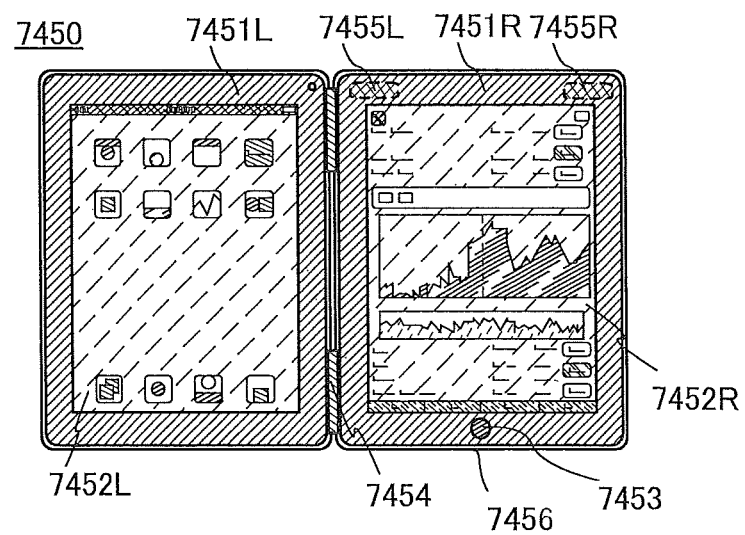

FIG. 7E illustrates an example of a folding computer. A folding computer 7450 includes a housing 7451L and a housing 7451R connected by hinges 7454. The folding computer 7450 further includes an operation button 7453, a left speaker 7455L, and a right speaker 7455R. In addition, a side surface of the folding computer 7450 is provided with an external connection port 7456, which is not illustrated. Note that when the folding computer is folded on the hinges 7454 so that a display portion 7452L provided in the housing 7451L and a display portion 7452R provided in the housing 7451R can face each other, the display portions can be protected by the housings.

Each of the display portions 7452L and 7452R is a component which can display images and to which information can be input by touch with a finger or the like. For example, the icon for the installed program is selected by touch with a finger, so that the program can be started. Further, changing the distance between fingers touching two positions of the displayed image enables zooming in or out on the image. Drag of a finger touching one position of the displayed image enables drag and drop of the image. Selection of the displayed character or symbol on the displayed image of a keyboard by touch with a finger enables information input.

Further, the computer 7450 can also include a gyroscope, an acceleration sensor, a global positioning system (GPS) receiver, a fingerprint sensor, or a video camera. For example, a detection device including a sensor which detects inclination, such as a gyroscope or an acceleration sensor, is provided to determine the orientation of the computer 7450 (whether the computer is placed horizontally or vertically for a landscape mode or a portrait mode) so that the orientation of the display screen can be automatically changed.

Furthermore, the computer 7450 can be connected to a network. The computer 7450 not only can display information on the Internet but also can be used as a terminal which controls another electronic device connected to the network from a distant place.

Figure 7F:
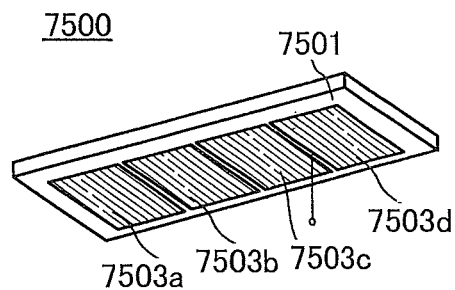

FIG. 7F illustrates an example of a lighting device. In a lighting device 7500, light-emitting devices 7503a, 7503b, 7503c, and 7503d of one embodiment of the present invention are incorporated in a housing 7501 as light sources. The lighting device 7500 can be attached to a ceiling, a wall, or the like.

Note that this embodiment can be combined with any of the other embodiments in this specification as appropriate.

This application is based on Japanese Patent Application serial no. 2011-259289 filed with Japan Patent Office on Nov. 28, 2011, the entire contents of which are hereby incorporated by reference.

What is claimed is:

1. A light-emitting device comprising:
a first substrate;
a second substrate which is capable of transmitting an energy ray and is over the first substrate;
a sealed object between the first substrate and the second substrate;
a sealant surrounding the sealed object, the sealant attaching the first substrate to the second substrate; and
a plurality of metal layers overlapping with the sealant, each of the plurality of metal layers comprising a metal element selected from aluminum, copper, chromium, tantalum, titanium, molybdenum, or tungsten and having higher reflectivity with respect to the energy ray than the first substrate,
wherein the sealant includes a glass,
wherein, in a top view of the light-emitting device, a first part of the sealant extends in a first direction, a second part of the sealant extends in a second direction substantially orthogonal to the first direction, and a corner of the sealant is located between the first part of the sealant and the second part of the sealant, and
wherein the plurality of metal layers are arranged in stripe and obliquely intersect the corner of the sealant to cross both of the first part of the sealant and the second part of the sealant.

2. The light-emitting device according to claim 1,
wherein the sealed object is at least one of an electronic element, a light-emitting element including a layer containing a light-emitting organic compound, a circuit element, a memory element, and an arithmetic element.

3. The light-emitting device according to claim 1,
wherein the energy ray includes at least one of an electron beam, a light beam, a microwave beam, and an ultrasonic beam.

4. The light-emitting device according to claim 1,
wherein the first substrate is a glass substrate, a ceramic substrate, a metal substrate, a lamination of a resin substrate and an inorganic material, a substrate formed of fiberglass-reinforced plastics, or a substrate formed of a prepreg, and
wherein the second substrate is a glass substrate, a ceramic substrate, a metal substrate, a lamination of a resin substrate and an inorganic material, a substrate formed of fiberglass-reinforced plastics, a substrate formed of a prepreg, a quartz substrate, a sapphire substrate, or a substrate formed of polyvinyl fluoride.

5. The light-emitting device according to claim 1,
wherein the plurality of metal layers comprises a connection terminal, an antenna, or a coil of the sealed object.

6. A light-emitting device comprising:
a first substrate;
a second substrate;
a sealant attaching the first substrate to the second substrate; and
a plurality of metal layers overlapping with the sealant, each of the plurality of metal layers comprising a metal element selected from aluminum, copper, chromium, tantalum, titanium, molybdenum, or tungsten,
wherein, in a top view of the light-emitting device, a first part of the sealant extends in a first direction, a second part of the sealant extends in a second direction substantially orthogonal to the first direction, and a corner of the sealant is located between the first part of the sealant and the second part of the sealant,
wherein the plurality of metal layers are arranged in stripe and obliquely intersect the corner of the sealant to cross both of the first part of the sealant and the second part of the sealant, and
wherein the plurality of metal layers obliquely intersecting the corner of the sealant are arranged at intervals which are different from intervals of the plurality of metal layers along the first part of the sealant and the second part of the sealant.

7. The light-emitting device according to claim 6, wherein the sealant includes a glass.

8. The light-emitting device according to claim 6,
wherein the first substrate is a glass substrate, a ceramic substrate, a metal substrate, a lamination of a resin substrate and an inorganic material, a substrate formed of fiberglass-reinforced plastics, a substrate faulted of a prepreg, and
wherein the second substrate is a glass substrate, a ceramic substrate, a metal substrate, a lamination of a resin substrate and an inorganic material, a substrate formed of fiberglass-reinforced plastics, a substrate formed of a prepreg, a quartz substrate, a sapphire substrate, or a substrate formed of polyvinyl fluoride.

9. The light-emitting device according to claim 6,
wherein the plurality of metal layers comprises a connection terminal, an antenna, or a coil of a sealed object interposed between the first substrate and the second substrate.

* * * * *